US009172038B2

United States Patent
Hayakawa et al.

(10) Patent No.: US 9,172,038 B2
(45) Date of Patent: Oct. 27, 2015

(54) NONVOLATILE MEMORY ELEMENT AND METHOD OF MANUFACTURING THE SAME

(71) Applicant: Panasonic Corporation, Osaka (JP)

(72) Inventors: Yukio Hayakawa, Kyoto (JP); Takumi Mikawa, Shiga (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/371,331

(22) PCT Filed: Oct. 4, 2013

(86) PCT No.: PCT/JP2013/005926
§ 371 (c)(1),
(2) Date: Jul. 9, 2014

(87) PCT Pub. No.: WO2014/076869
PCT Pub. Date: May 22, 2014

(65) Prior Publication Data
US 2015/0041748 A1    Feb. 12, 2015

(30) Foreign Application Priority Data
Nov. 14, 2012  (JP) ................................. 2012-250456

(51) Int. Cl.
*H01L 29/00*    (2006.01)
*H01L 45/00*    (2006.01)
(Continued)

(52) U.S. Cl.
CPC ............ *H01L 45/146* (2013.01); *H01L 27/101* (2013.01); *H01L 27/24* (2013.01);
(Continued)

(58) Field of Classification Search
CPC ... H01L 27/101; H01L 45/04; H01L 45/1246; H01L 27/24; H01L 29/685
See application file for complete search history.

(56) References Cited

U.S. PATENT DOCUMENTS

| 6,549,447 B1 | 4/2003 | Fricke et al. |
| 6,707,698 B2 | 3/2004 | Fricke et al. |

(Continued)

FOREIGN PATENT DOCUMENTS

| JP | 9-55476 | 2/1997 |
| JP | 2003-188349 | 7/2003 |

(Continued)

OTHER PUBLICATIONS

International Search Report issued Dec. 24, 2013 in corresponding International Application No. PCT/JP2013/005926.

*Primary Examiner* — Ngan Ngo
(74) *Attorney, Agent, or Firm* — Wenderoth, Lind & Ponack, L.L.P.

(57) ABSTRACT

A variable resistance layer between a first electrode and a second electrode includes: a first variable resistance layer contacting the first electrode; and a second variable resistance layer contacting the second electrode and having a lower degree of oxygen deficiency than the first variable resistance layer. A principal face of the first variable resistance layer which is close to the second variable resistance layer is flat. The second variable resistance layer is in contact with both the first variable resistance layer and the second electrode in a polygonal region including a vertex inward of an outline of the variable resistance layer and vertices along the outline when seen from a direction perpendicular to the principal face of the variable resistance layer, and is not in contact with at least one of the first variable resistance layer and the second electrode in a region outside the region inside the polygon.

7 Claims, 20 Drawing Sheets

(51) Int. Cl.
  *H01L 27/24* (2006.01)
  *H01L 27/10* (2006.01)
  *H01L 29/68* (2006.01)

(52) U.S. Cl.
  CPC ............ *H01L 29/685* (2013.01); *H01L 45/04* (2013.01); *H01L 45/08* (2013.01); *H01L 45/122* (2013.01); *H01L 45/1233* (2013.01); *H01L 45/1246* (2013.01); *H01L 45/1273* (2013.01); *H01L 45/1608* (2013.01); *H01L 45/1625* (2013.01); *H01L 45/1675* (2013.01)

(56) References Cited

U.S. PATENT DOCUMENTS

| | | |
|---|---|---|
| 7,582,889 B2 | 9/2009 | Asano |
| 8,022,502 B2 | 9/2011 | Kanzawa et al. |
| 8,350,245 B2 | 1/2013 | Tsuji |
| 8,389,972 B2 | 3/2013 | Mikawa et al. |
| 8,394,669 B2 | 3/2013 | Arita et al. |
| 8,445,319 B2 | 5/2013 | Kanzawa et al. |
| 8,492,743 B2 | 7/2013 | Mikawa et al. |
| 8,530,321 B2 | 9/2013 | Ninomiya et al. |
| 2003/0081446 A1 | 5/2003 | Fricke et al. |
| 2003/0161175 A1 | 8/2003 | Fricke et al. |
| 2007/0123018 A1 | 5/2007 | Asano |
| 2009/0283736 A1 | 11/2009 | Kanzawa et al. |
| 2011/0220862 A1 | 9/2011 | Arita et al. |
| 2011/0220863 A1* | 9/2011 | Mikawa et al. .......... 257/4 |
| 2011/0240942 A1 | 10/2011 | Tsuji |
| 2011/0294259 A1 | 12/2011 | Kanzawa et al. |
| 2012/0252184 A1 | 10/2012 | Ninomiya et al. |
| 2013/0140514 A1 | 6/2013 | Mikawa et al. |
| 2014/0110659 A1* | 4/2014 | Murase et al. .......... 257/4 |
| 2014/0113430 A1 | 4/2014 | Hayakawa et al. |
| 2014/0278160 A1* | 9/2014 | Wei et al. .......... 702/58 |
| 2014/0312293 A1* | 10/2014 | Mikawa et al. .......... 257/4 |
| 2015/0171324 A1* | 6/2015 | Mikawa et al. .......... 257/4 |

FOREIGN PATENT DOCUMENTS

| | | |
|---|---|---|
| JP | 2007-149913 | 6/2007 |
| JP | 2008-198941 | 8/2008 |
| JP | 4253038 | 4/2009 |
| JP | 2010-62265 | 3/2010 |
| JP | 2010-103555 | 5/2010 |
| JP | 2010-141249 | 6/2010 |
| JP | 4722236 | 7/2011 |
| WO | 2008/149484 | 12/2008 |
| WO | 2010/067585 | 6/2010 |
| WO | 2011/007538 | 1/2011 |
| WO | 2011/030559 | 3/2011 |
| WO | 2011/074243 | 6/2011 |
| WO | 2013/054506 | 4/2013 |

* cited by examiner

Step (linear)

Step (angled)

NONVOLATILE MEMORY ELEMENT AND METHOD OF MANUFACTURING THE SAME

TECHNICAL FIELD

The present invention relates to nonvolatile memory elements suited for high level integration and high speed and to methods of manufacturing the same. The present invention particularly relates to a variable resistance nonvolatile memory element into which data is written through application of electric pulses of different polarity.

BACKGROUND ART

Recent years have seen increasing high performance in electronic devices such as mobile information devices and information appliances following the development of digital technology. With the increased high performance in these electronic devices, there has been rapid progress in the increase in scale, level of integration, and speed of nonvolatile memory devices to be used, and the uses for such memory devices are also expanding rapidly. Among these, applications for large-capacity nonvolatile memories represented by a flash memory are rapidly expanding. In addition, as a next-generation nonvolatile memory to replace the flash memory, research and development on a nonvolatile memory device which uses a variable resistance nonvolatile memory element (also called variable resistance element) is advancing. Here, variable resistance element refers to an element which has a property in which its resistance value reversibly changes according to electrical signals, and is capable of storing information corresponding to the resistance value in a nonvolatile manner.

As an example of such variable resistance element, there is proposed a nonvolatile memory device having a variable resistance layer in which transition metal oxides of different oxygen content atomic percentages are stacked. For example, Patent Literature (PTL) 1 discloses selectively causing the occurrence of oxidation/reduction reaction in an electrode interface which is in contact with a variable resistance layer having a high oxygen content atomic percentage, to stabilize resistance change.

The aforementioned conventional variable resistance element includes a lower electrode, a variable resistance layer, and an upper electrode, and a memory array is configured from a two-dimensional or three-dimensional array of such variable resistance element. In each of the variable resistance elements, the variable resistance layer is of a stacked structure including a first variable resistance layer and a second variable resistance layer, and the first and second variable resistance layers comprise the same type of transitional metal oxide. The oxygen content atomic percentage of the transitional metal oxide forming the second variable resistance layer is higher than the oxygen content atomic percentage of the transitional metal oxide forming the first variable resistance layer.

By adopting such a structure, when voltage is applied to the variable resistance element, most of the voltage is applied to the second variable resistance layer which has a high oxygen content atomic percentage and exhibits a higher resistance value. Furthermore, oxygen, which can contribute to the reaction, is abundant in the vicinity of the interface. Therefore, oxidation/reduction reaction occurs selectively at the interface between the upper electrode and the second variable resistance layer, and stable resistance change can be realized.

Furthermore, in the above-described conventional variable resistance element, in order to transition to a state in which resistance change is started, it is necessary to initially apply voltage to the variable resistance element to form a filament in the second variable resistance layer (such filament formation is referred to as break, and the voltage applied to the variable resistance element at such time is referred to as an initial break voltage). In view of this, there is proposed a nonvolatile memory device in which a step is formed in a variable resistance element to allow easy formation of an initial filament. For example, in PTL 2, a step is formed in the interface between a first variable resistance element and a second variable resistance element, and the second variable resistance layer is formed to cover the bend of the step. By adopting the above-described configuration, the shape of the step of the first variable resistance layer is reflected, thereby forming the bend in the second variable resistance layer on the step, and thus it is possible, through electric field concentration, to cause the break phenomenon even with a low voltage, with the bend as a starting point.

CITATION LIST

Patent Literature

[PTL 1] Japanese Patent No. 4253038
[PTL 2] Japanese Patent No. 4722236

SUMMARY OF INVENTION

Technical Problem

However, in the above-described conventional variable resistance element, there is the problem that, in the case of miniaturization, variation in the characteristics of nonvolatile memory elements caused by variation in the shape of the step becomes obvious.

The present invention was conceived in view of this problem and has as an object to provide (i) a nonvolatile memory element capable of resolving the increase in initial break voltage and variation in characteristics occurring in the case of miniaturization, as well as operating on low voltage, and (ii) a method of manufacturing the same.

Solution to Problem

In order to achieve the aforementioned object, an aspect of a nonvolatile memory element disclosed herein includes: a first electrode; a second electrode; and a variable resistance layer between the first electrode and the second electrode and having a resistance value that reversibly changes according to an electrical signal applied between the first electrode and the second electrode, wherein the variable resistance layer includes a first variable resistance layer and a second variable resistance layer, the first variable resistance layer comprising a first metal oxide and contacting the first electrode, the second variable resistance layer comprising a second metal oxide and contacting the second electrode, the second metal oxide having a degree of oxygen deficiency lower than the degree of oxygen deficiency of the first metal oxide, a principal face of the first variable resistance layer which is close to the second variable resistance layer is flat, and the second variable resistance layer is in contact with both the first variable resistance layer and the second electrode in an interior region of a polygon including a single first vertex located inward of an outline of the variable resistance layer and plural second vertices located along the outline of the variable resistance layer when seen from a direction perpendicular to the principal face of the variable resistance layer, and is not in contact with at least one of the first variable resistance layer and the second electrode in a region outside the interior region of the polygon.

Advantageous Effects of Invention

The above-described nonvolatile memory element is capable of lowering initial break voltage without increasing characteristics variation even when miniaturized, and is thus capable of realizing stable low-voltage operation.

DESCRIPTION OF EMBODIMENTS (Underlying Knowledge Forming Basis of the Present Disclosure)

Prior to detailed descriptions, new knowledge acquired by the inventors through experimentation shall be described below. It should be noted that although the aforementioned knowledge is described below with reference to FIG. 14A, FIG. 14B, FIG. 14C, FIG. 15, and FIG. 16, this is done to contribute to the understanding of the embodiments to be described later. Therefore, the present invention is not limited to such figures and their descriptions.

As described earlier, the following problem exists in a conventional variable resistance nonvolatile memory element (variable resistance element).

In order to realize a large-capacity nonvolatile memory device, it is necessary to miniaturize the variable resistance element and decrease memory cell area. In addition, increasing element film thinness is essential for microfabrication of the variable resistance element. As such, in the conventional technique (PTL 2) in which a step is formed in the variable resistance element, the depth of the step to be formed has to be made shallow.

Figure 15:
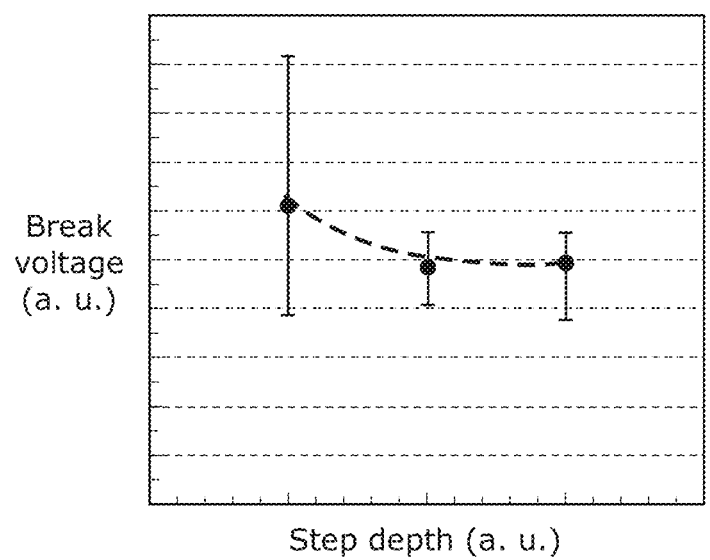
FIG. 15 is a characteristics graph illustrating the relationship between initial break voltage and step depth in a conventional nonvolatile memory element.
Figure 16:
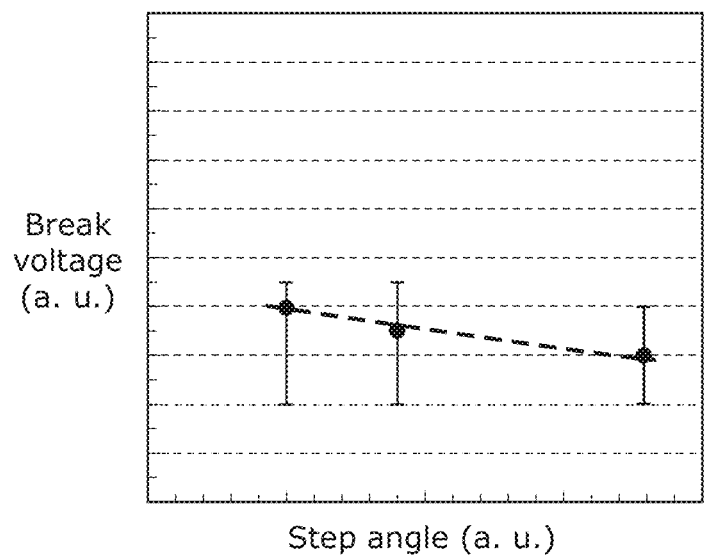
FIG. 16 is a characteristics graph illustrating the relationship between initial break voltage and the angle of a bend of a step in a conventional nonvolatile memory element.

FIG. 15 is a characteristics graph illustrating a relationship between the depth of a step (horizontal axis; arbitrary unit) and initial break voltage (vertical axis; arbitrary unit). FIG. 16 is a characteristics graph illustrating a relationship between the angle of a bend of a step (horizontal axis; arbitrary unit) and initial break voltage (vertical axis; arbitrary unit). As is apparent from FIG. 15 and FIG. 16, when the depth of the step is shallow and the angle of the bend is small, an increase in initial voltage occurs due to the weakening of the electric field concentration at the bend. Furthermore, suppression of variations in step depth and bend angle becomes more difficult.

Therefore, in the case where a variable resistance element is miniaturized, in the conventional technique in which a step is formed in the variable resistance element, the low voltage break effect is reduced. In addition, when the depth of the step becomes shallow, initial break voltage increases, and characteristics variation caused by step shape variation becomes obvious.

Figure 14A:
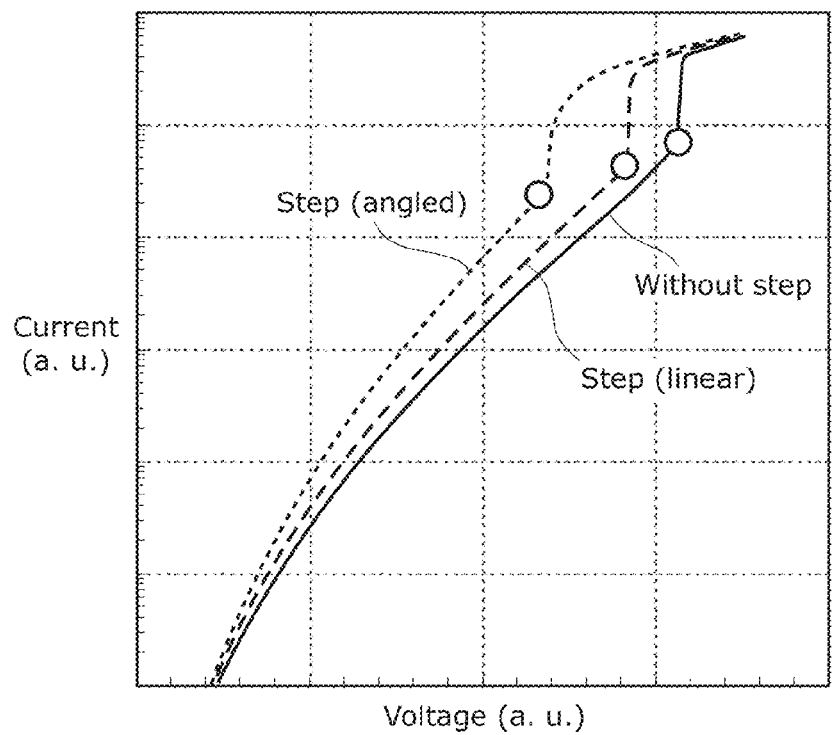
FIG. 14A is a characteristics graph illustrating the dependence between initial break characteristics and step shape in a conventional nonvolatile memory element.

FIG. 14A is a characteristics graph illustrating a relationship between a step formed in an interface between a first variable resistance layer and a second variable resistance layer and initial break characteristics, in a variable resistance element in which a variable resistance layer is of a stacked structure including the first variable resistance layer and the second variable resistance layer. In FIG. 14A, the initial break characteristics is illustrated using a graph representing a relationship between the voltage applied to the variable resistance element during an initial break operation (vertical axis; arbitrary unit) and the current which flows (horizontal axis; arbitrary unit). A white circle on the graph denotes the point at which a break occurs, and the voltage at the point of the white circle denotes the initial break voltage.

Figure 14B:
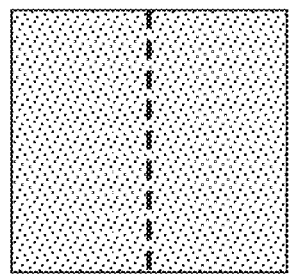
FIG. 14B is a view of a linear step shape as seen from above the principal face of an element.
Figure 14C:
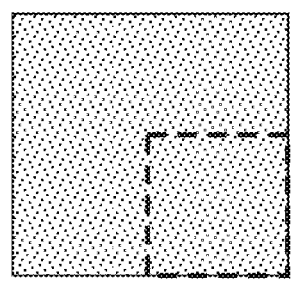
FIG. 14C is a view of a curved step shape as seen from above the principal face of an element.

FIG. 14B is a view of a linear step shape formed in an interface between a first variable resistance layer and a second variable resistance layer, seen from above the principal face, and FIG. 14C is a view of an angled step shape, seen from above the principal face. The two type of steps used here, which differ in shape when seen from above the principal face, are formed using a lithography technique, and have the same step depth and bend angle when seen from a cross-sectional direction.

As is apparent from FIG. 14A, the initial break voltage is different according to the step shape seen from above the principal face of the variable resistance element. In particular, initial break voltage is lowest when the step shape seen from above the principal face of the variable resistance element is angled. In other words, a new phenomenon was found in which the electric field concentration during initial break operation at the step formed in the interface between the first variable resistance layer and the second variable resistance layer is dependent not only on the shape of the bend seen from the cross-sectional direction but also the step shape seen from above the principal face.

The present invention was conceived and completed based on the knowledge that electrical field concentration is different depending on the step shape seen from above the principal face of the variable resistance element described above and the characteristics of the initial break operation of a variable resistance element configured of the stacked structure of a first variable resistance layer and a second variable resistance layer.

The present invention has as an object to provide a nonvolatile memory element which resolves the increase in initial break voltage and variation in characteristics that occur when a variable resistance element is miniaturized, and is capable of operating on low voltage.

In order to achieve the aforementioned object, a nonvolatile memory element according to an aspect disclosed herein includes: a first electrode; a second electrode; and a variable resistance layer between the first electrode and the second electrode and having a resistance value that reversibly changes according to an electrical signal applied between the first electrode and the second electrode, wherein the variable resistance layer includes a first variable resistance layer and a second variable resistance layer, the first variable resistance layer comprising a first metal oxide and contacting the first electrode, the second variable resistance layer comprising a second metal oxide and contacting the second electrode, the second metal oxide having a degree of oxygen deficiency lower than the degree of oxygen deficiency of the first metal oxide, a principal face of the first variable resistance layer which is close to the second variable resistance layer is flat, and the second variable resistance layer is in contact with both the first variable resistance layer and the second electrode in an interior region of a polygon including a single first vertex located inward of an outline of the variable resistance layer and plural second vertices located along the outline of the variable resistance layer when seen from a direction perpendicular to the principal face of the variable resistance layer, and is not in contact with at least one of the first variable resistance layer and the second electrode in a region outside the interior region of the polygon.

According to such a configuration, in a region of the first variable resistance layer which is in contact with both the second variable resistance layer and the first electrode, electric fields concentrate, during the initial break operation, in the first vertex which, when seen from above the principal face, is formed by the two sides of the region and is not in contact with the edges of the variable resistance layer. Therefore, break voltage can be lowered without forming a step in the variable resistance layer, and thus the variable resistance element can be miniaturized.

Furthermore, an interior angle of the first vertex of the polygon may be greater than 0 degrees and less than or equal to 90 degrees, or greater than or equal to 270 degrees and less than 360 degrees.

According to such a configuration, electric field intensity intensifies at the first vertex, and thus the location at which a filament is formed can be induced. Therefore, since the effects of significant etching damage can be reduced at the element edges, stable resistance changing operation becomes possible.

Furthermore, a protective layer may be provided between the first variable resistance layer and the second variable resistance layer, in the region outside the interior region of the polygon. Furthermore, a protective layer may be provided between the second variable resistance layer and the second electrode, in the region outside the interior region of the polygon. Furthermore, the second electrode may be provided only in the interior region of the polygon.

According to these configurations, even in the case where the variable resistance element is miniaturized, the region of the first variable resistance layer that is in contact with both the second variable resistance layer and the first electrode can be easily separated using the protective layer, and thus the controllability of a vertex formed by the two sides of the region improves, and break voltage lowering and break voltage variation suppression become possible.

Furthermore, each of the first metal oxide and the second metal oxide may be a transition metal oxide or aluminum oxide. Furthermore, the transition metal oxide may be any one of tantalum oxide, hafnium oxide, and zirconium oxide.

According to such a configuration, stable resistance changing operation becomes possible, and a highly reliable nonvolatile memory element can be provided.

A method of manufacturing a nonvolatile memory element according to an aspect disclosed herein includes: forming a first electrode; forming a first variable resistance layer having a flat top face, on the first electrode; forming a protective layer on the first variable resistance layer; removing a portion of the protective layer to expose the first variable resistance layer; forming a second variable resistance layer covering the protective layer and the first variable resistance layer that is exposed; and forming a second electrode on the second variable resistance layer.

According to such a configuration, since the second variable resistance layer is formed after the processing of the protective layer, a uniform film thickness can be ensured without the second variable resistance layer being etched, and thus a stable initial break voltage can be obtained.

Furthermore, in the removing of a portion of the protective layer, the protective layer may be etched under a condition that an etching rate of the protective layer is higher than an etching rate of the first variable resistance layer.

According to such a configuration, it is possible to provide a nonvolatile memory element which offers high selectivity during the etching of the protective layer, enables the thinning of the first variable resistance layer due to over-etching to be suppressed, and has stable resistance changing operation.

Furthermore, the nonvolatile memory element may be formed in a region which, when seen from a stacking direction, is surrounded by a predetermined outline, and in the removing of a portion of the protective layer, the portion of the protective layer which, when seen from the stacking direction, overlaps with an interior region of a polygon may be removed, the polygon including a single first vertex located inward of the outline and plural second vertices located along the outline.

According to such a configuration, it is possible to provide a nonvolatile memory element in which electric fields concentrate at the first vertex at the time of initial break operation. Such a nonvolatile memory element is suited for miniaturization because break voltage lowering is possible without forming a step in the variable resistance layer.

Furthermore, an interior angle of the first vertex of the polygon may be greater than 0 degrees and less than or equal to 90 degrees, or greater than or equal to 270 degrees and less than 360 degrees.

According to such a configuration, electric field intensity intensifies at the first vertex, and thus it is possible to provide a nonvolatile memory element in which the location at which a filament is formed can be induced. Such a nonvolatile memory element is capable of stable resistance changing operation because the effects of significant etching damage can be reduced at the element edges.

A method of manufacturing a nonvolatile memory element according to an aspect disclosed herein includes: forming a first electrode; forming a first variable resistance layer having a flat top face, on the first electrode; forming a second variable resistance layer on the first variable resistance layer; forming a protective layer on the second variable resistance layer; removing a portion of the protective layer to expose the second variable resistance layer; and forming a second electrode covering the protective layer and the second variable resistance layer that is exposed.

According to such a configuration, during the etching of the protective layer, the interface of the second variable resistance layer and the first variable resistance layer is not exposed to the etching gas. Therefore, movement of oxygen atoms is not inhibited by the mixing in of etching gas, and thus stable resistance changing operation becomes possible.

Furthermore, in the removing of a portion of the protective layer, the protective layer may be etched under a condition that an etching rate of the protective layer is higher than an etching rate of the second variable resistance layer.

According to such a configuration, it is possible to provide a nonvolatile memory element which offers high selectivity during the etching of the protective layer, enables the thinning of the second variable resistance layer due to over-etching to be suppressed, and has stable resistance changing operation.

Furthermore, the nonvolatile memory element may be formed in a region which, when seen from a stacking direction, is surrounded by a predetermined outline, and in the removing of a portion of the protective layer, the portion of the protective layer which, when seen from the stacking direction, overlaps with an interior region of a polygon may be removed, the polygon including a single first vertex located inward of the outline and plural second vertices located along the outline.

According to such a configuration, it is possible to provide a nonvolatile memory element in which electric fields concentrate at the first vertex at the time of initial break operation. Such a nonvolatile memory element is suited for miniaturization since break voltage lowering is possible without forming a step in the variable resistance layer.

Furthermore, an interior angle of the first vertex of the polygon may be greater than 0 degrees and less than or equal to 90 degrees, or greater than or equal to 270 degrees and less than 360 degrees.

According to such a configuration, electric field intensity intensifies at the first vertex, and thus it is possible to provide a nonvolatile memory element in which the location at which a filament is formed can be induced. Such a nonvolatile memory element is capable of stable resistance changing operation because the effects of significant etching damage can be reduced at the element edges.

A method of manufacturing a nonvolatile memory element according to an aspect disclosed herein includes: forming a first electrode; forming a first variable resistance layer having a flat top face, on the first electrode; forming a second variable resistance layer on the first variable resistance layer; forming a second electrode on the second variable resistance layer; and removing a portion of the second electrode.

According to such a configuration, during the etching of the second electrode, the interface of the second variable resistance layer and the first variable resistance layer is not exposed to the etching gas. Therefore, movement of oxygen atoms is not inhibited by the mixing in of etching gas, and thus stable resistance changing operation becomes possible.

Furthermore, the nonvolatile memory element may be formed in a region which, when seen from a stacking direction, is surrounded by a predetermined outline, and in the removing of a portion of the second electrode, the portion of the second electrode which, when seen from the stacking direction, does not overlap with an interior region of a polygon may be removed, the polygon including a single first vertex located inward of the outline and plural second vertices located along the outline.

According to such a configuration, it is possible to provide a nonvolatile memory element in which electric fields concentrate at the first vertex at the time of initial break operation. Such a nonvolatile memory element is suited for miniaturization since break voltage lowering is possible without forming a step in the variable resistance layer.

Furthermore, an interior angle of the first vertex of the polygon may be greater than 0 degrees and less than or equal to 90 degrees, or greater than or equal to 270 degrees and less than 360 degrees.

According to such a configuration, electric field intensity intensifies at the first vertex, and thus it is possible to provide a nonvolatile memory element in which the location at which a filament is formed can be induced. Such a nonvolatile memory element is capable of stable resistance changing operation because the effects of significant etching damage can be reduced at the element edges.

Hereinafter, exemplary embodiments shall be described with reference to the drawings. It should be noted that identical components are assigned the same reference signs and their description shall not be repeated. Furthermore, the shapes of transistors, memory units, and so on, are merely schematic, and their number, and so on, are set merely for the sake of convenient illustration.

Before describing individual embodiments, the fundamental concept of the nonvolatile memory elements to be disclosed shall be described below based on an example of a nonvolatile memory element.

Figure 1:
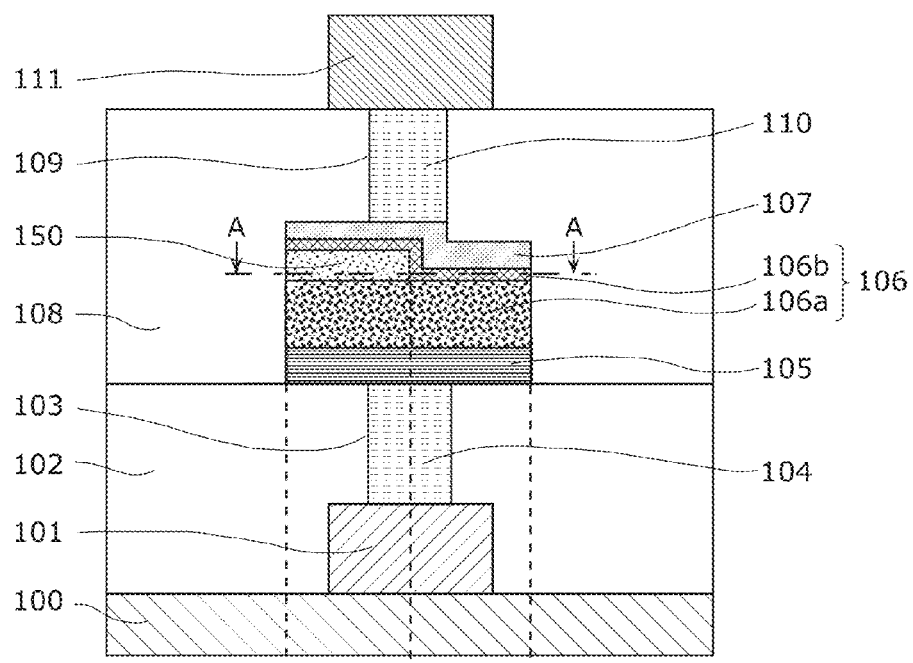
FIG. 1 illustrates, in (a), a vertical cross-sectional view of an example of a nonvolatile memory element in Embodiment 1, and, in (b), a horizontal cross-sectional view of a cross-section along line A-A as seen in the arrow direction.
Figure 1:
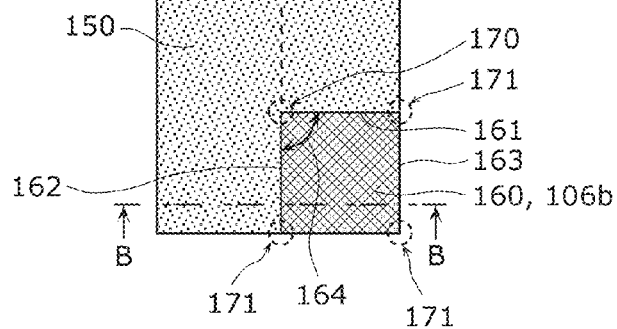

In FIG. 1, (a) is a vertical cross-sectional view of an example of a structure of a nonvolatile memory element 10, and (b) is a horizontal cross-sectional view of an example of the structure of the nonvolatile memory element 10. In FIG. 1, (a) is a cross-sectional view of the cross-section along line B-B in (b) as seen from arrow direction B, and (b) is a cross-sectional view of the cross-section along line A-A in (a) as seen from arrow direction A. Here, the term horizontal refers to the direction which is parallel to the principal face of a substrate 100 above which the nonvolatile memory element 10 is to be formed, and the term vertical refers to the stacking direction of the layers forming the nonvolatile memory element 10.

As illustrated in (a) in FIG. 1, in the nonvolatile memory element 10, a protective layer 150 is provided on a portion of a first variable resistance layer 106a included in a variable resistance layer 106, and the remaining portion of the first variable resistance layer 106a and the protective layer 150 are covered by a second variable resistance layer 106b above which a second electrode 107 is formed. As a result, the second variable resistance layer 106b can be divided into a region which is in contact with both the first variable resistance layer 106a and the second electrode 107 and a region which is in contact with both the protective layer 150 and the second electrode 107. In addition, the principal face of the first variable resistance layer 106a which is close to the second variable resistance layer 106b (i.e., the top face) is flat.

Furthermore, as illustrated in (b) in FIG. 1, the second variable resistance layer 106b is in contact with both the first variable resistance layer 106a and the second electrode 107 in a region 160 inside a polygon 163 which, when seen from a direction perpendicular to the principal face of the variable resistance layer 106, includes a single vertex 170 located inward of the outline of the variable resistance layer 106 and plural vertices 171 located along the outline. Furthermore, the second variable resistance layer 106 band is not in contact with at least one of the first variable resistance layer 106a and the second electrode 107 in the region outside the polygon 163. Here, the vertex 170 is an example of a first vertex, and each of the vertices 171 is an example of a second vertex.

With regard to the nonvolatile memory element 10 having such a structure, the electric field intensity of the second variable resistance layer 106b during the initial break operation in the case where an angle 164 formed by the two sides 161 and 162 which intersect at the vertex 170, in other words, the interior angle of the vertex 170 of the polygon 163, is 90 degrees, was analyzed through simulation.

Figure 2:
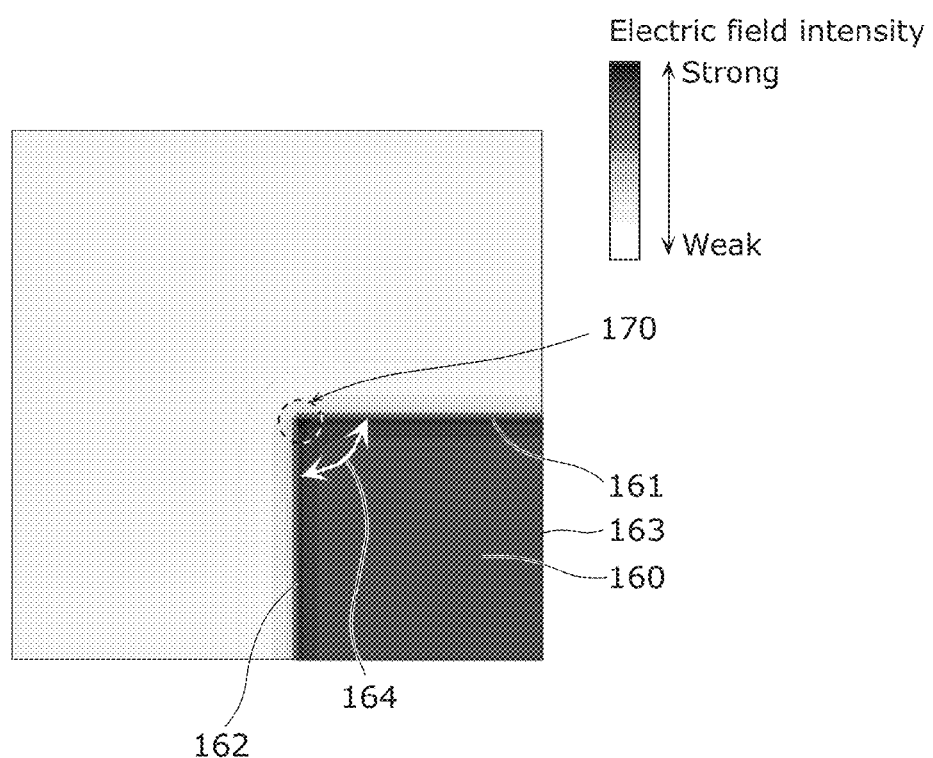
FIG. 2 is a characteristics chart illustrating electric field intensity distribution in the case where initial break voltage is applied to a nonvolatile memory element in Embodiment 1.

FIG. 2 illustrates, in a two dimensional diagram, the horizontal distribution of the electric field intensity of the second variable resistance layer 106b. In the electrostatic field simulation used in the analysis, the voltage distribution of a system including a conductor, an electrode, and a point charge that have an arbitrary three-dimensional shape was analyzed through a difference method using an EEM Corporation EEM-STF (Ver. 2.2). For the coordinate system used in calculations, a three-dimensional XYZ coordinate system is used, and 50 meshes are set uniformly in each direction.

As illustrated in FIG. 2, in the second variable resistance layer 106b, there is a strong electric field in the region 160, and, in particular, electric fields are concentrated in the vertex 170.

Figure 3A:
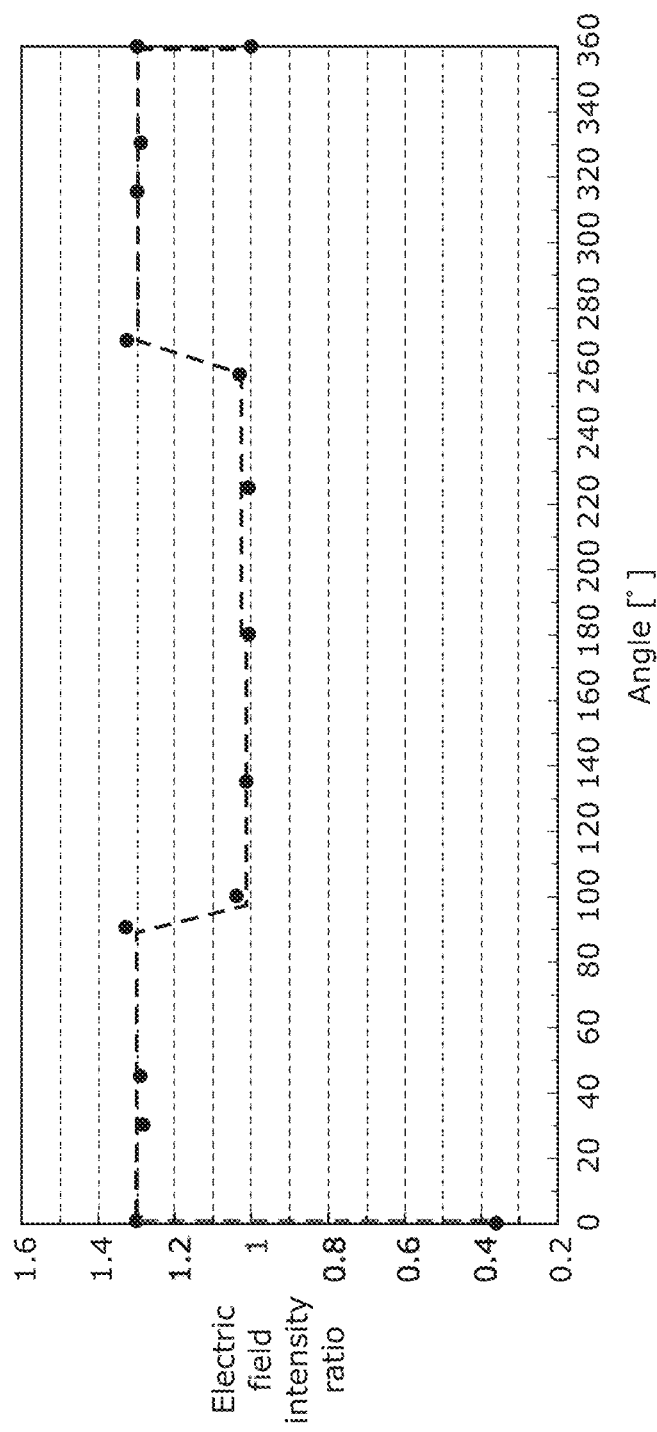
FIG. 3A is a characteristics graph illustrating a relationship between an angle of a vertex of a nonvolatile memory element in Embodiment 1 and electric field intensity (with electric field intensity when the angle of the vertex is 180 degrees being standardized as 1).

FIG. 3A is a characteristics graph illustrating a relationship between the angle 164 and electric field intensity. The vertical axis in FIG. 3A denotes electric field intensity values obtained when the electric field intensity when the angle 164 is 180 degrees is standardized as 1, and the horizontal axis denotes the angle 164.

Figure 3B:
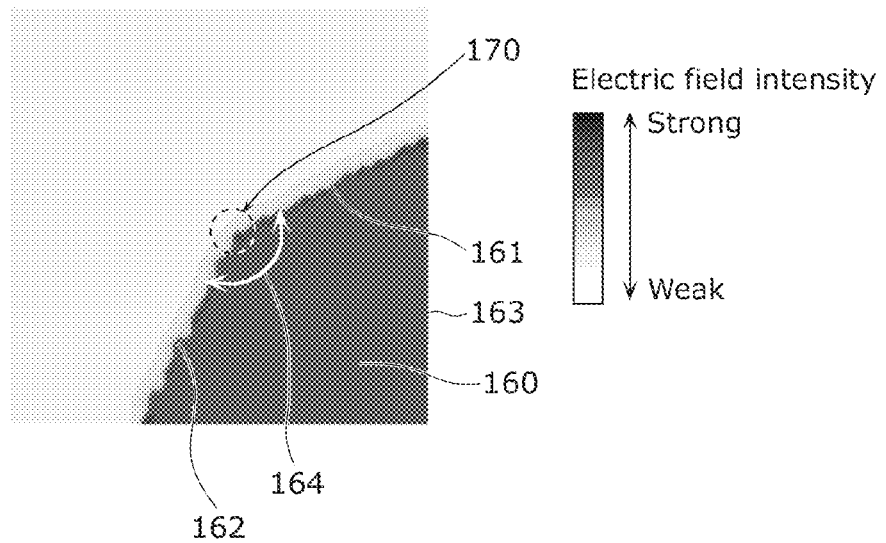
FIG. 3B is a characteristics chart illustrating electric field intensity distribution in the case where an angle of a vertex of a nonvolatile memory element in Embodiment 1 is 135 degrees.
Figure 3C:
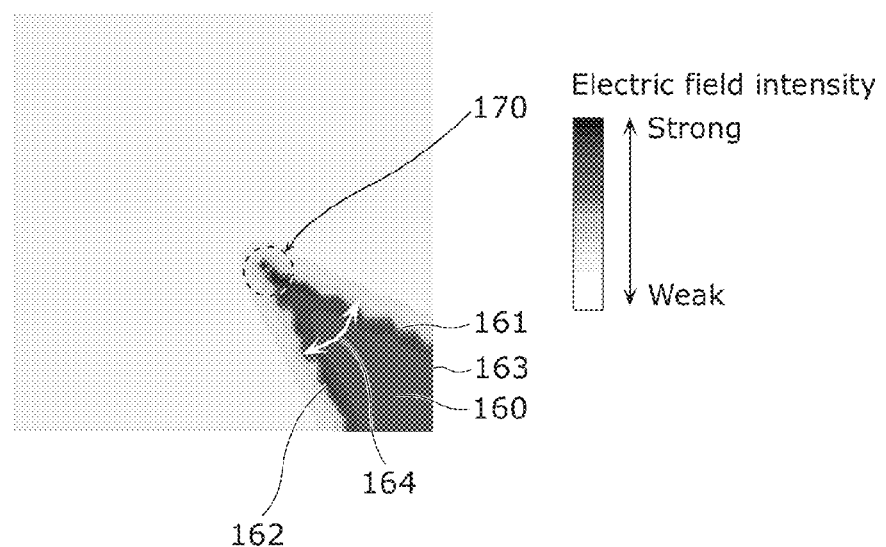
FIG. 3C is a characteristics graph illustrating electric field intensity distribution in the case where an angle of a vertex of a nonvolatile memory element in Embodiment 1 is 45 degrees.

FIG. 3B and FIG. 3C illustrate the electric field intensity distribution as seen from the top face of the variable resistance layer in the case where the angle 164 is 135 degrees and 45 degrees, respectively.

As is apparent from FIG. 3A, electric field intensity when the angle 164 is greater than 0 degrees and less than or equal to 90 degrees or greater than or equal to 270 degrees and less than 360 degrees, is greater than the electric field intensity when the angle 164 is a value other than those above. Furthermore, the angle dependency of the electrical field intensity is not dependent on the characteristics (for example, film thickness, permittivity, etc.) of the protective layer and the characteristics (for example, oxygen content atomic percentage, resistance value, film thickness) of the variable resistance layer.

As described above, the nonvolatile memory element 10, which includes, in the region 160 of the second variable resistance layer 106b which is in contact with both the first variable resistance layer 106a and the second electrode 107, the vertex 170 which, when seen from above the principal face, is formed by the two sides 161 and 162 of the region 160 and is not in contact with the edges of the variable resistance layer 106, is capable of concentrating the electric fields during initial break operation at the vertex 170, and is thus capable of lowering initial break voltage.

In the nonvolatile memory element 10, the principal face of the first variable resistance layer 106a which is close to the second variable resistance layer 106b (i.e., the top face) is flat, and thus the nonvolatile memory element 10 clearly has a different structure from the nonvolatile memory element disclosed in PTL 2. Furthermore, forming a step by processing the first variable resistance layer 106a as disclosed in PTL 2 is not necessary, and thus initial break voltage can be lowered. Therefore, it is possible to suppress characteristics variation caused by processing variation occurring when a step is formed in the first variable resistance layer 106a.

As described above, according to the nonvolatile memory element 10, break voltage can be lowered and characteristics variation can be suppressed in the case of miniaturization, and thus stable low voltage operation can be realized.

Embodiment 1

The nonvolatile memory element 10 according to Embodiment 1 shall be described in more detail below with reference to the drawings.

[Element Configuration]

As described above, an example of the structure of the nonvolatile memory element 10 is illustrated in the vertical cross-sectional view in (a) and the horizontal cross-sectional view in (b) in FIG. 1.

As illustrated in (a) and (b) in FIG. 1, the nonvolatile memory element 10 includes: the substrate 100 which is a semiconductor substrate, and the like, on which a first line 101 is formed; a first interlayer insulating layer 102 comprising a silicon oxide film (film thickness: at least 500 nm and at most 100 nm) formed on the substrate 100 and covering the first line 101; and a first contact plug 104 having tungsten (W) as a primary component and formed by being filled into a first contact hole 103 (diameter: at least 50 nm and at most 300 nm) which penetrates through the first interlayer insulating layer 102 and reaches the first line 101.

Although not clearly illustrated in (a) in FIG. 1, the top face of the first contact plug 104 and the top face of the first interlayer insulating layer 102 are not continuous (that is, not coplanar), and a recess (depth: at least 5 nm and at most 50 nm) may be created in the non-continuous portion.

In addition, a variable resistance element (500 nm square), which includes: a first electrode 105 (film thickness: at least 5 nm and at most 100 nm) comprising tantalum nitride (TaN); the variable resistance layer 106 (film thickness: at least 20 nm and at most 100 nm); and the second electrode 107 (film thickness: at least 5 nm and at most 100 nm) comprising a noble metal (platinum (Pt), iridium (Ir), palladium (pd), or the like), is formed on the first interlayer insulating layer 102 and covering the first contact plug 104. A second interlayer insulating layer 108 comprising a silicon oxide film (SiO, film thickness: at least 500 nm and at most 1000 nm) is formed covering the variable resistance element, a second contact hole 109 (diameter: at least 50 nm and at most 300 nm) is formed penetrating through the second interlayer insulating layer 108 and reaching the second electrode 107, and a second contact plug 110 having tungsten (W) as a primary component is formed inside the second contact hole 109.

A second line 111 is formed on the second interlayer insulating layer 108 and covering the second contact plug 110.

It should be noted that the step created on the first contact plug 104 is not transferred onto the surface of the first electrode 105, and thus the surface of the first electrode 105 is extremely flat throughout its entirety, and a continuous face (flat face) is maintained. Therefore, although the nonvolatile memory element 10 includes the first contact plug 104 below the first electrode 105, the interface between the first electrode 105 and the first variable resistance layer 106a is flat.

Here, the variable resistance layer 106 includes the first variable resistance layer 106a (film thickness: at least 18 nm and at most 95 nm), the second variable resistance layer 106b (film thickness: at least 2 nm and at most 10 nm), and the protective layer 150.

The variable resistance layer 106 is a layer which is interposed between the first electrode 105 and the second electrode 107 and has a resistance value that reversibly changes based on an electrical signal applied between the first electrode 105 and the second electrode 107. For example, the variable resistance layer 106 is a layer that reversibly transitions between a high resistance state and a low resistance state according to the polarity of the voltage applied between the first electrode 105 and the second electrode 107. The variable resistance layer 106 includes, in a stacked structure, at least the two layers of a first variable resistance layer 106a connected to the first electrode 105, and the second variable resistance layer 106b connected to the second electrode 107.

The first variable resistance layer 106a comprises an oxygen-deficient first metal oxide, and the second variable resistance layer 106b comprises a second metal oxide having a degree of oxygen deficiency lower than the degree of oxygen deficiency of the first metal oxide. A minute local region having a degree of oxygen deficiency that reversibly changes according to the application of an electric pulse is formed in the second variable resistance layer 106b. It is thought that the local region includes a filament configured from an oxygen defect site.

"Degree of oxygen deficiency" refers to the percentage of deficient oxygen with respect to the amount of oxygen comprising an oxide of the stoichiometric composition (in the case where there are plural stoichiometric compositions, the stoichiometric composition having the highest resistance value among the stoichiometric compositions) in the metal oxide. Compared to a metal oxide with another composition, a metal oxide having a stoichiometric composition is more stable and has a higher resistance value.

For example, when the metal is tantalum (Ta), the oxide having the stoichiometric composition according to the above-described definition is $Ta_2O_5$, and thus can be expressed as $TaO_{2.5}$. The degree of oxygen deficiency of $TaO_{2.5}$ is 0%, and the degree of oxygen deficiency of $TaO_{1.5}$ becomes: degree of oxygen deficiency=(2.5−1.5)/2.5=40%. Furthermore, a metal oxide having excess oxygen has a degree of oxygen deficiency with a negative value. It should be noted that in this Description, unless stated otherwise, the degree of oxygen deficiency includes positive values, 0 (zero), and negative values.

An oxide having a lower degree of oxygen deficiency has a higher resistance value since it is closer to an oxide having a stoichiometric composition, and an oxide having a higher degree of oxygen deficiency has a lower resistance value since it is closer to the metal included in the oxide.

The "oxygen content atomic percentage" is the percentage of the total number of atoms occupied by oxygen atoms. For example, the oxygen content atomic percentage of $Ta_2O_5$ is the percentage of the total number of atoms occupied by oxygen atoms (O/(Ta+O)), and becomes 71.4 atm %. Therefore, oxygen-deficient tantalum oxide has an oxygen content atomic percentage greater than 0 and less than 71.4 atm %. For example, when the metal included in a first metal oxide layer and the metal included in a second metal oxide layer are of the same type, the oxygen content atomic percentage is in a correspondence relation with the degree of oxygen deficiency, in other words, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

For the metal included in the variable resistance layer 106, a transition metal or aluminum (Al) can be used. For a transition metal, it is possible to use tantalum (Ta), titanium (Ti), hafnium (Hf), zirconium (Zr), niobium (Nb), tungsten (W), nickel (Ni), and so on. Since the transition metal can have plural oxidation states, different resistance states can be realized through redox reaction.

For example, in the case of using tantalum oxide, the resistance value of the variable resistance layer 106 can be rapidly changed in a stable manner when, in the case where the composition of the first metal oxide included in the first variable resistance layer 106a is $TaO_x$, x is at least 0.9 and at most 1.6, and when, in the case where the composition of the second metal oxide included in the second variable resistance layer 106b is $TaO_y$, y is larger than the value of x. In this case, the film thickness of the second variable resistance layer 106b may be 3 to 4 nm.

For example, in the case of using hafnium oxide, the resistance value of the variable resistance layer 106 can be rapidly changed in a stable manner when, in the case where the composition of the first metal oxide included in the first variable resistance layer 106a is $HfO_x$, x is at least 0.9 and at most 1.6, and when, in the case where the composition of the second metal oxide included in the second variable resistance layer 106b is $HfO_y$, y is larger than the value of x. In this case, the film thickness of the second variable resistance layer 106b may be 3 to 4 nm.

For example, in the case of using zirconium oxide, the resistance value of the variable resistance layer 106 can be rapidly changed in a stable manner when, in the case where the composition of the first metal oxide included in the first variable resistance layer 106a is $ZrO_x$, x is at least 0.9 and at most 1.4, and when, in the case where the composition of the second metal oxide included in the second variable resistance layer 106b is $ZrO_y$, y is larger than the value of x. In this case, the film thickness of the second variable resistance layer 106b may be 1 to 5 nm.

Different metals may be used for the first metal included in the first metal oxide forming the first variable resistance layer 106a and the second metal included in the second metal oxide forming the second variable resistance layer 106b. In this case, the second metal oxide may have a lower degree of oxygen deficiency, that is, a higher resistance, than the first metal oxide. By adopting such a configuration, more of the voltage applied between the first electrode 105 and the second electrode 107 at the time of resistance changing is distributed to the second variable resistance layer 106b, and thus it is becomes possible to more easily cause the redox reaction occurring in the second metal oxide.

Furthermore, when using mutually different materials for the first metal and the second metal, the standard electrode potential of the second metal may be lower than the standard electrode potential of the first metal. The standard electrode potential indicates a property in which resistance to oxidation is greater with a higher value. Accordingly, the occurrence of the redox reaction is facilitated in the second metal oxide having a relatively low standard electrode potential. It should be noted that, with regard to the resistance change phenomenon, it is thought that the resistance value (degree of oxygen deficiency) of the minute local region formed inside the second metal oxide having a high resistance changes because a redox reaction occurs in the local region and the filament (conduction path) changes.

For example, by using oxygen-deficient tantalum oxide ($TaO_x$) for the first metal oxide included in the first variable resistance layer 106a and using titanium oxide ($TiO_2$) for the second metal oxide included in the second variable resistance layer 106b, stable resistance changing operation can be obtained. Titanium (standard electrode potential=−1.63 eV) is a material having a lower standard electrode potential than tantalum (standard electrode potential=−0.6 eV). In this manner, by using an oxide of a metal having a lower standard electrode potential than the first metal oxide for the second metal oxide, the redox reaction occurs more easily in the second variable resistance layer 106b. As other combinations, aluminum oxide ($Al_2O_3$) can be used for the second variable resistance layer 106b that becomes a high resistance layer. For example, oxygen-deficient tantalum oxide ($TaO_x$) may be used for the first variable resistance layer 106a, and aluminum oxide ($Al_2O_3$) can be used for the second variable resistance layer 106b.

With regard to the resistance change phenomena in the variable resistance layer 106 having the stacked structure, it is thought that, for both cases of changing to high resistance and changing to low resistance, the resistance value of the minute local region formed inside the second variable resistance layer 106b having a high resistance changes because a redox reaction occurs in the local region and the filament (conduction path) inside the local region changes.

Specifically, when a voltage that is positive with respect to the voltage of the first electrode 105 is applied to the second electrode 107 connected to the second variable resistance layer 106b, the oxygen ions in the variable resistance layer 106 are pulled toward the second variable resistance layer 106b-side. With this, a redox reaction occurs in the minute local region formed in the second variable resistance layer 106b, and the degree of oxygen deficiency decreases. As a result, it is thought that it becomes difficult for the filament inside the local region to connect, and the resistance value of the local region increases.

Conversely, when a voltage that is negative with respect to the voltage of the first electrode 105 is applied to the second electrode 107 connected to the second variable resistance layer 106b, the oxygen ions in the second variable resistance layer 106b are pushed toward the first variable resistance layer 106a-side. With this, a redox reaction occurs in the minute local region formed in the second variable resistance layer 106b, and the degree of oxygen deficiency increases. As a result, it is thought that it becomes easy for the filament inside the local region to connect, and the resistance value of the local region decreases.

The second electrode 107 connected to the second variable resistance layer 106b comprising the second metal oxide having a lower degree of oxygen deficiency comprises a material, such as platinum (pt), iridium (Ir), palladium (Pd), for example, which has a higher standard electrode potential compared to the metal used in the second metal oxide and the material used for the first electrode 105. Furthermore, the first electrode 105 connected to the first variable resistance layer 106a comprising the first metal oxide having a higher degree of oxygen deficiency may comprise a material, such as tungsten (W), nickel (Ni), tantalum (Ta), titanium (Ti), aluminum (Al), tantalum nitride (TaN), for example, which has a lower standard electrode potential compared to the metal included in the first metal oxide. The standard electrode potential indicates a property in which resistance to oxidation is greater with a higher value.

In other words, the standard electrode potential V2 of the material used for the second electrode 107, the standard electrode potential Vr2 of the metal included in the second metal oxide, the standard electrode potential Vr1 of the metal included in the first metal oxide, and the standard electrode potential V1 of the material used for the first electrode 105 may satisfy a relationship in which Vr2<V2 and V1<V2, In addition, a relationship in which V2>Vr2 and Vr1≥V1 may be satisfied.

By adopting the above-described configuration, a redox reaction selectively occurs in the second metal oxide, in the vicinity of the interface between the second electrode 107 and the second variable resistance layer 106b, and thus a stable variable resistance phenomenon occurs.

The protective layer 150 is in contact with a portion of the first variable resistance layer 106a and a portion of the second variable resistance layer 106b, and comprises, for example, a silicon oxide film (film thickness: at least 5 nm and at most 50 nm). The protective layer 150 comprises a material having an etching condition that allows for a higher etching rate than the first metal oxide forming the first variable resistance layer 106a or the second metal oxide forming the second variable resistance layer 106b. The protective layer 150 may, for example, be an insulating film containing silicon or an insulating film containing carbon.

Referring again to FIG. 1 and looking at the variable resistance layer 106 of the nonvolatile memory element 10 from above the principal face, a portion of the first variable resistance layer 106a is covered by the protective layer 150, and the remaining region of the first variable resistance layer 106a and the protective layer 150 are covered by the second variable resistance layer 106b. In addition, the second variable resistance layer 106b is covered by the second electrode 107. Moreover, the region 160, which is a portion of the second variable resistance layer 106b that is in contact with both the first variable resistance layer 106a and the second electrode 107, is formed.

The region 160 includes a corner that is not in contact with the edges of the variable resistance layer 106, in other words, the vertex 170 located inward of the outline of the variable resistance layer 106 as seen in the stacking direction of the nonvolatile memory element 10 (i.e., the direction perpendicular to the principal face of the variable resistance layer 106). The angle 164 of the interior angle of the vertex 170 of the polygon 163 may be greater than 0 degrees and less than or equal to 90 degrees, or greater than or equal to 270 degrees and less than 360 degrees. Furthermore, the vertex 170 may be located at a central position when seen from above the principal face of the variable resistance layer 106.

Although the angle 164 of the interior angle of the vertex 170 of the polygon 163 defining the outline of the region 160 is, as an example, 90 degrees in the nonvolatile memory element 10 illustrated in (b) in FIG. 1, the angle 164 of the interior angle is not limited to 90 degrees. For example, the angle 164 of the interior angle may be 270 degrees.

Figure 4:
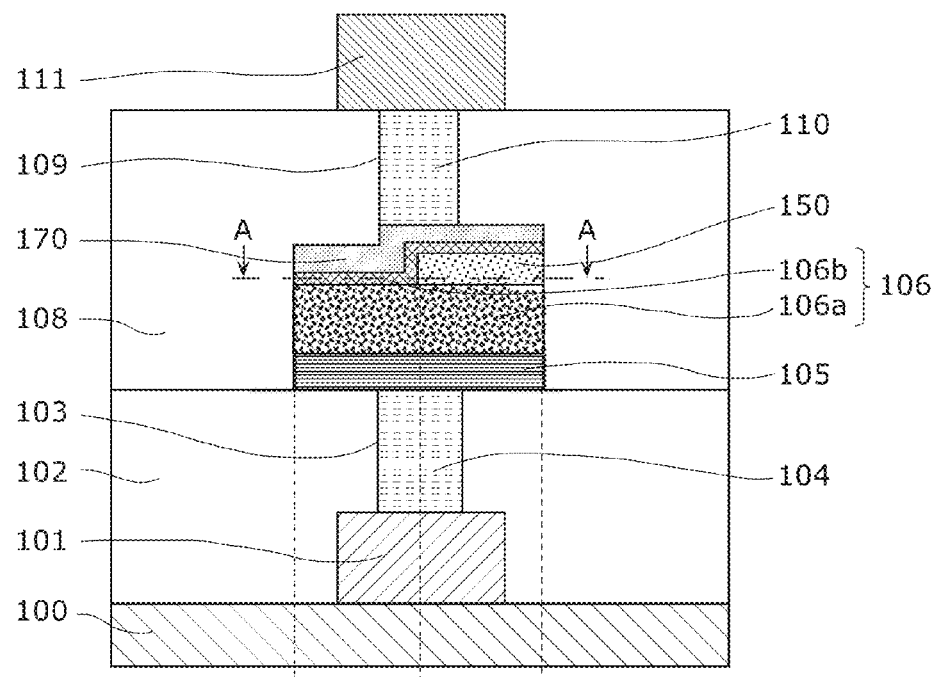
FIG. 4 illustrates, in (a), a vertical cross-sectional view of an example of a nonvolatile memory element in Embodiment 1, and, in (b), is a horizontal cross-sectional view of a cross-section along line A-A as seen in the arrow direction.
Figure 4:
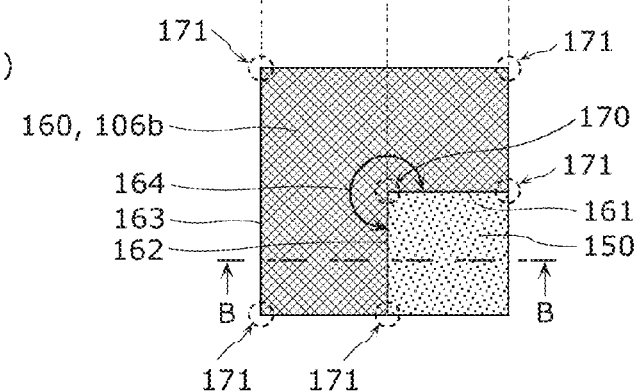

In FIG. 4, (a) is a vertical cross-sectional view of an example of a structure of a nonvolatile memory element 15, and (b) is a horizontal cross-sectional view of an example of the structure of the nonvolatile memory element 15. In FIG. 4, (a) is a cross-sectional view of the cross-section along line B-B in (b) as seen from arrow direction B, and (b) is a cross-sectional view of the cross-section along line A-A in (a) as seen from arrow direction A. The expressions vertical and horizontal are used with the same meanings as in the foregoing description. In FIG. 4, the same reference signs are used for structural components that are the same as in FIG. 1, and description thereof shall not be repeated. As illustrated in (b) in FIG. 4, in the nonvolatile memory element 15, the angle 164 of the interior angle is 270 degrees.

According to the configurations of the nonvolatile memory element 10 and the nonvolatile memory element 15, in the region 160 of the second variable resistance layer 106b which is in contact with both the first variable resistance layer 106a and the second electrode 107, electric fields during the initial break operation concentrate at the vertex 170 which, when seen from above the principal face, is formed by the two sides 161 and 162 of the region 160 and is not contact with the edges of the variable resistance layer. Therefore, break voltage can be lowered without forming a step in the first variable resistance layer 106a, and, as a result, miniaturization of the variable resistance element becomes possible, and thus a nonvolatile memory element suited for use in a large-scale memory can be provided.

As described in FIG. 3A, the effect of concentrating the electrical fields at the vertex 170 is noticeable when the angle 164 of the interior angle of the vertex 170 of the region 160 is greater than 0 degrees and less than or equal to 90 degrees or greater than or equal to 270 degrees and less than 360 degrees. Therefore, the present invention includes variable resistance elements in which the angle 164 of the interior angle of the vertex 170 of the region 160 is greater than 0 degrees and less than or equal to 90 degrees or greater than or equal to 270 degrees and less than 360 degrees.

[Manufacturing Method]

FIG. 5A to FIG. 5F, FIG. 6A to FIG. 6E, FIG. 7A, and FIG. 7B are cross-sectional views of examples of a method of manufacturing main parts of the nonvolatile memory element 10 or the nonvolatile memory element 15. FIG. 6A to FIG. 6E are provided with top views of the nonvolatile memory element 10 or the nonvolatile memory element 15 as seen from above in the stacking direction. The nonvolatile memory element 10 or the nonvolatile memory element is eventually formed, by being patterned, in the region surrounded by the outline illustrated in the top views in FIG. 6A to FIG. 6E seen in the stacking direction.

A method of manufacturing main parts of the nonvolatile memory element 10 or the nonvolatile memory element 15 shall be described using the aforementioned figures. In the subsequent description, there are instances where structural components whose shapes change due to patterning are given the same reference signs but called different names before and after patterning.

Figure 5A:
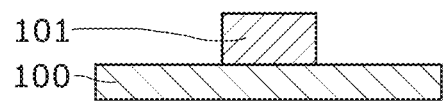
FIG. 5A is a cross-sectional view illustrating a method of manufacturing a nonvolatile memory element in Embodiment 1.

First, as illustrated in FIG. 5A, in a process of forming the first line 101, the first line 101 is formed by forming a conductive layer (film thickness: at least 400 nm and at most 600 nm) comprising aluminum, on the substrate 100 in which a transistor, a lower layer line, and so on are formed, and performing patterning on the conductive layer.

Figure 5B:
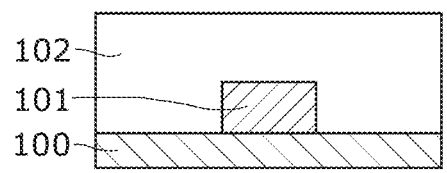
FIG. 5B is a cross-sectional view illustrating a method of manufacturing a nonvolatile memory element in Embodiment 1.

Next, as illustrated in FIG. 5B, in a process of forming the first interlayer insulating layer 102, the first interlayer insulating layer 102 (film thickness: at least 500 nm and at most 1,000 nm) is formed by forming an insulating layer on the substrate 100 and covering the first line 101, and subsequently planarizing the surface (top face) of the insulating layer. A plasma TENS film can be used for the first interlayer insulating layer 102. Furthermore, in order to reduce the amount of parasitic capacitance between lines, a fluorine-containing oxide (for example, FSG) or a low-k material, and so on, can be used for the first interlayer insulating layer 102.

Figure 5C:
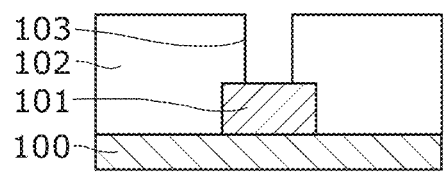
FIG. 5C is a cross-sectional view illustrating a method of manufacturing a nonvolatile memory element in Embodiment 1.

Next, as illustrated in FIG. 5C, in a process of forming the first contact hole 103, patterning is performed on the first interlayer insulating layer 102, using the desired mask, to form the first contact hole 103 (diameter: at least 50 nm and at most 300 nm) which penetrates through the first interlayer insulating layer 102 and reaches the first line 101. Here, when the width of the first line 101 is less than the diameter of the first contact hole 103, the area in which the first line 101 and the first contact plug 104 are in contact changes due to the impact of mask misalignment, and thus, for example, cell current fluctuates. From the point of view of preventing the above, the width of the first line 101 is made greater than the diameter of the first contact hole 103.

Figure 5D:
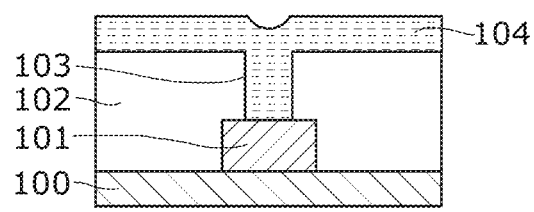
FIG. 5D is a cross-sectional view illustrating a method of manufacturing a nonvolatile memory element in Embodiment 1.

Next, in a process of forming the first contact plug 104, first, a TiN/Ti layer (film thickness: at least 5 nm and at most 30 nm) which functions as an adhesion layer and a diffusion barrier is formed as a lower layer using the sputtering method, and tungsten (W, film thickness: at least 200 nm and at most 400 nm) which serves as the primary component is formed as an upper layer using the CVD method. As a result, as illustrated in FIG. 5D, the first contact hole 103 is filled with a conductive layer 104 having a stacked structure and which is to become the first contact plug 104. However, a depression (depth: at least 5 nm and at most 100 nm) which reflects the shape of the base is created in the top face of the conductive layer 104 above the first contact hole 103.

Figure 5E:
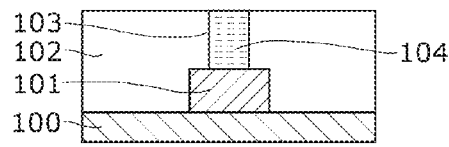
FIG. 5E is a cross-sectional view illustrating a method of manufacturing a nonvolatile memory element in Embodiment 1.

Next, as illustrated in FIG. 5E, in the process of forming the first contact plug 104, planarization polishing using a chemical mechanical polishing method (CMP method) is performed on the entire surface of the wafer to remove the unnecessary conductive material 104 on the first interlayer insulating layer 102, and thus form the first contact plug 104 inside the first contact hole 103. At this time, the top face of the first contact plug 104 and the top face of the first interlayer insulating layer 102 are not continuous, and a recess (depth: at least 5 nm and at most 50 nm) is created in the non-continuous portion. This is because, as an insulator and a conductor, respectively, the materials comprised in the first interlayer insulating layer 102 and the first contact plug 104 are necessarily different, and thus their polishing rates in the CMP method are different. This is an unavoidable phenomenon which necessarily occurs when using different types of materials.

Figure 5F:
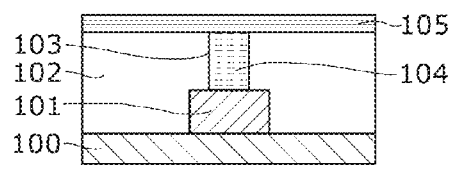
FIG. 5F is a cross-sectional view illustrating a method of manufacturing a nonvolatile memory element in Embodiment 1.

Next, as illustrated in FIG. 5F, in a process of forming a conductive layer 105 (the first electrode 105), the conductive layer 105 (film thickness: 50 to 200 nm) comprising a tantalum nitride and which later becomes the first electrode 105 is formed with the sputtering method, on the first interlayer insulating layer 102 and covering the first contact plug 104. The conductive layer 105 is also formed in the portion of the recess created at the top of the first contact plug 104 inside the first contact hole 103. Next, in a process of forming the conductive layer 105 (the first electrode 105), planarization polishing using the CMP method is performed on the entire surface of the wafer to form the conductive electrode 105 (film thickness: 20 to 100 nm) which becomes the first electrode 105 after patterning.

Figure 6A:
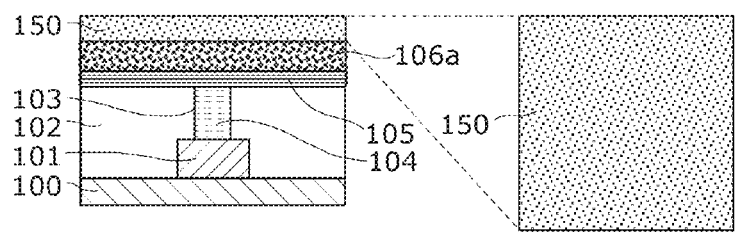
FIG. 6A is a cross-sectional view and a top view illustrating a method of manufacturing a nonvolatile memory element in Embodiment 1.

Next, as illustrated in FIG. 6A, in a process of forming the first variable resistance layer 106a and the protective layer 150, the first variable resistance layer 106a comprising the first metal oxide is formed on the conductive layer 105. Here, the first variable resistance layer 106a is formed using what is called a reactive sputtering method in which sputtering is performed on a tantalum target in an argon (Ar) and oxygen gas atmosphere. The oxygen content atomic percentage of the first variable resistance layer 106a is at least 50 atm % and at most 65 atm %, the resistivity is at least 2 mΩcm and at most 50 mΩcm, and the film thickness is at least 20 nm and at most 100 nm.

Next, the protective layer 150 is formed on the first variable resistance layer 106a. Here, the protective layer 150 is formed using a silicon nitride film (film thickness: at least 5 nm and at most 50 nm) formed using the plasma CVD method. The protective layer 150 comprises a material having an etching condition that allows for a higher etching rate than the first metal oxide forming the first variable resistance layer 106a or the second metal oxide forming the second variable resistance layer 106b. The protective layer 150 may, for example, be an insulating film containing silicon or an insulating film containing carbon.

Figure 6B:
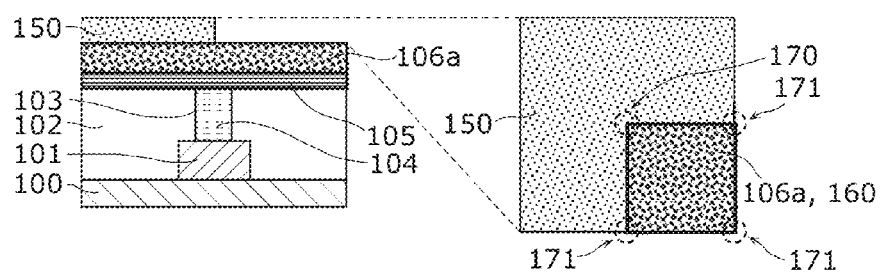
FIG. 6B is a cross-sectional view and a top view illustrating a method of manufacturing a nonvolatile memory element in Embodiment 1.
Figure 6C:
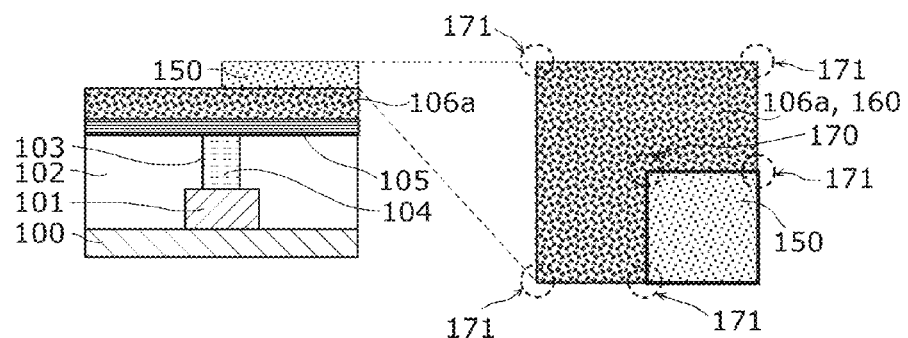
FIG. 6C is a cross-sectional view and a top view illustrating a method of manufacturing a nonvolatile memory element in Embodiment 1.

Next, as illustrated in FIG. 6B or FIG. 6C, in a process of processing the protective layer 150 to expose the first variable resistance layer 106a, a portion of the protective layer 150 is etched using the desired mask. At this time, an inert gas such as Ar may be used as an etching gas in order to prevent fluorine (F), and so on, included in the etching gas from entering the first variable resistance layer 106a and causing etching damage which causes the film quality of the variable resistance layer to deteriorate. Furthermore, since the protective layer 150 has a higher etching rate than the first variable resistance layer 106a and etching selectivity can be ensured, a step is not formed in the surface of the first variable resistance layer 106a and the surface is flat. Furthermore, wet etching using an etching liquid containing hydrofluoric acid (HF) and so on may be performed. In this case, the fluorine (F) included in the etching liquid does not enter the variable resistance layer, and therefore does not cause the variable resistance layer to deteriorate.

As illustrated in the top views in FIG. 6B and FIG. 6C, the portion of the protective layer 150 which, when seen in the stacking direction, overlaps with the polygonal region 160 is removed. Here, the region 160 includes the single vertex 170, which is located inward of the outline surrounding the region in which the nonvolatile memory element 10 or the nonvolatile element 15 are formed, and plural vertices 171 located along the outline. The portion from which the protective layer 150 has been removed is indicated by the first variable resistance layer 106a that is exposed.

In FIG. 6B, the portion of the protective layer 150 located at the bottom right of the top view is removed. This configuration in which such a portion of the protective layer 150 is removed corresponds to that in the nonvolatile memory element 10 in FIG. 1. In FIG. 6C, the portion of the protective layer 150 located at the bottom left, top left, and top right of the top view is removed. This configuration in which such a portion of the protective layer 150 is removed corresponds to that in the nonvolatile memory element 15 in FIG. 4.

Figure 6D:
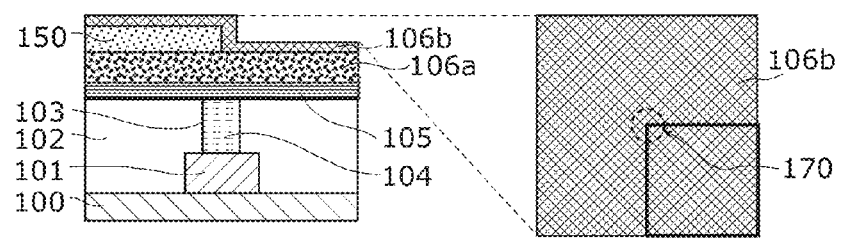
FIG. 6D is a cross-sectional view and a top view illustrating a method of manufacturing a nonvolatile memory element in Embodiment 1.

Next, as illustrated in FIG. 6D, in a process of forming the second variable resistance layer 106b, the second variable resistance layer 106b comprising the second metal oxide having a degree of oxygen deficiency lower than the degree of oxygen deficiency of the first metal oxide (the first variable resistance layer 106a) is formed covering the first variable resistance layer 106a and the protective layer 150. In the same manner as in the first variable resistance layer 106a, the second variable resistance layer 106b is formed with the reactive sputtering method of performing sputtering on a tantalum target in an oxygen gas atmosphere. The oxygen content atomic percentage of the second variable resistance layer 106b is at least 67 atm % and at most 71 atm %, the resistivity is at least 107 mΩcm, and the film thickness is at least 2 nm and at most 10 nm. Although the variable resistance layer is formed using reactive sputtering, a reactive sputtering method of performing sputtering on a tantalum oxide target in an oxygen gas atmosphere may be used, and the variable resistance layer may be formed by plasma oxidation in an atmosphere that includes oxygen.

Figure 6E:
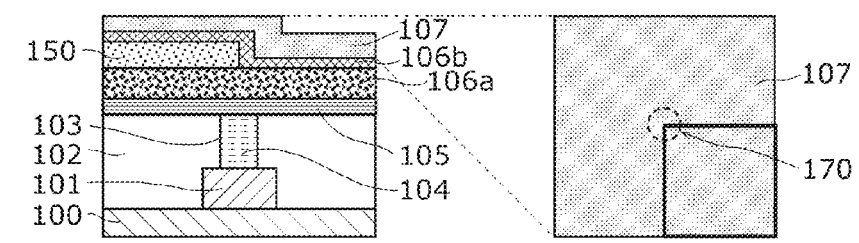
FIG. 6E is a cross-sectional view and a top view illustrating a method of manufacturing a nonvolatile memory element in Embodiment 1.

Next, as illustrated in FIG. 6E, in the process of forming a conductive layer 107 (the second electrode 107), the conductive layer 107 comprising a noble metal (platinum, iridium, palladium, and so on) which becomes the second electrode 107 is formed on the second variable resistance layer 106b.

Figure 7A:
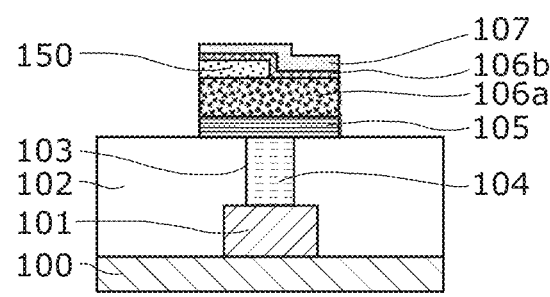
FIG. 7A is a cross-sectional view illustrating a method of manufacturing a nonvolatile memory element in Embodiment 1.

Next, as illustrated in FIG. 7A, in the process of forming the variable resistance element, patterning using the desired mask is performed on the conductive layer 105, the first variable resistance layer 106a, the second variable resistance layer 106b, and the conductive layer 107 illustrated in FIG. 6E to form the variable resistance element in which the variable resistance layer 106 configured of the stacked layers of the first variable resistance layer 106a and the second variable resistance layer 106b is held between the first electrode 105 and the first electrode 107. Since etching is difficult to perform on a noble metal and the like which is typified as a material having high standard electrode potential, when such a material is used for the second electrode 107, the variable resistance element can also be formed with such second electrode 107 as a hard mask. Although, in the present process, patterning is performed collectively on the respective layers of the variable resistance element using the same mask, patterning may be performed on a per layer basis.

Figure 7B:
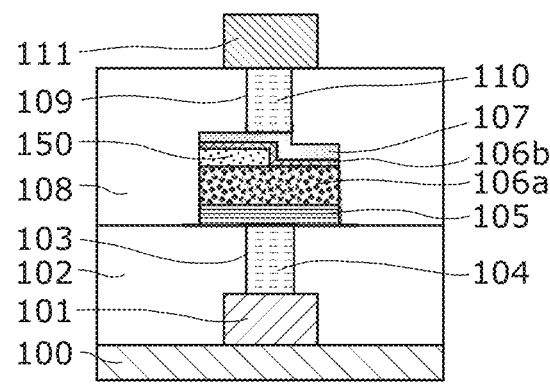
FIG. 7B is a cross-sectional view illustrating a method of manufacturing a nonvolatile memory element in Embodiment 1.

Lastly, as illustrated in FIG. 7B, the second interlayer insulating layer 108 (film thickness: at least 500 nm and at most 1000 nm) is formed covering the variable resistance element, and the second contact hole 109 and the second contact plug 110 are formed according to the same manufacturing method as in FIG. 6B and FIG. 6D. Subsequently, the second line 111 is formed covering the second contact plug 110, and the nonvolatile memory element 10 is completed.

With the above-described manufacturing method, the second variable resistance layer 106b is formed after the etching on the protective layer 150, and thus there is no etching damage on the second variable resistance layer 106b, and, as a result, a stable initial break voltage can be obtained.

Embodiment 2

A nonvolatile memory element 20 according to Embodiment 2 shall be described below with reference to the drawings.

[Element Configuration]

Figure 8:
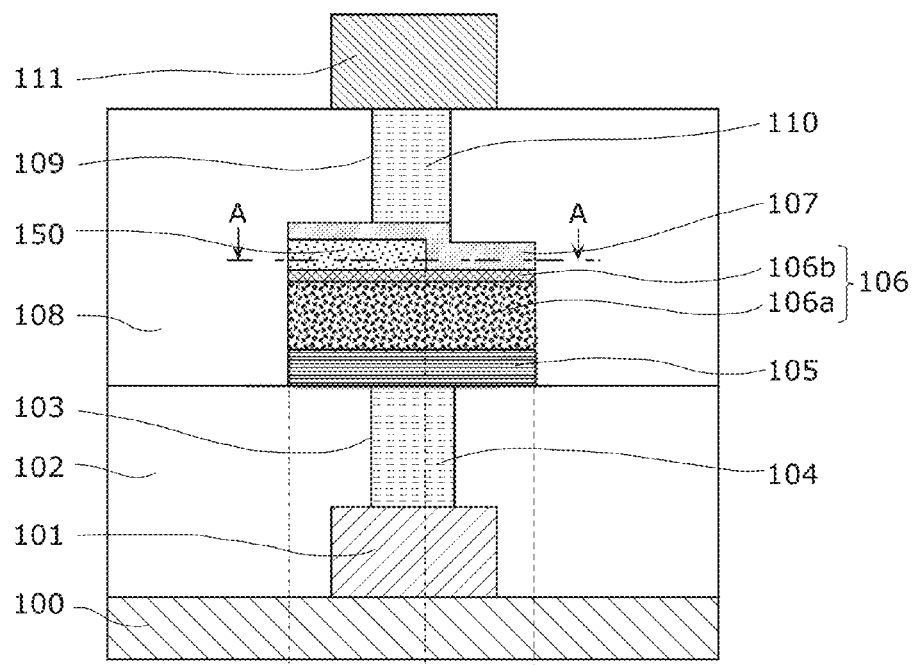
FIG. 8 illustrates, in (a), a vertical cross-sectional view of an example of a nonvolatile memory element in Embodiment 2, and, in (b), is a horizontal cross-sectional view of a cross-section along line A-A as seen in the arrow direction.
Figure 8:
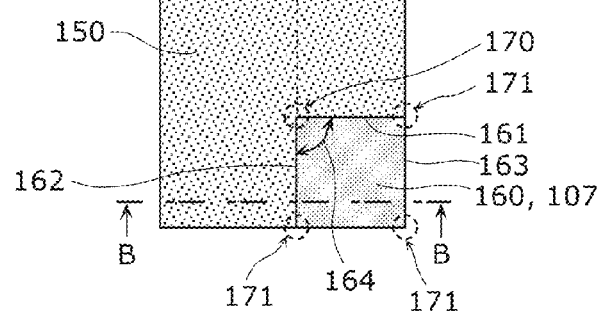

In FIG. 8, (a) is a vertical cross-sectional view of an example of a structure of a nonvolatile memory element 20, and (b) is a horizontal cross-sectional view of an example of the structure of the nonvolatile memory element 20. In FIG. 8, (a) is a cross-sectional view of the cross-section along line B-B in (b) as seen from arrow direction B, and (b) is a cross-sectional view of the cross-section along line A-A in (a) as seen from arrow direction A. The expressions vertical and horizontal are used with the same meanings as in the foregoing description. In FIG. 8, the same reference signs are used for structural components that are the same as in FIG. 1, and description thereof shall not be repeated.

As illustrated in (a) and (b) in FIG. 8, compared to the nonvolatile memory element 10 in FIG. 1, the nonvolatile memory element 20 is different in terms of the positional relationship between the protective layer 150 and the second variable resistance layer 106b.

Specifically, in the nonvolatile memory element 10, the protective layer 150 is formed on a portion of a first variable resistance layer 106a, the remaining portion of the first variable resistance layer 106a and the protective layer 150 are covered by a second variable resistance layer 106b, and, in addition, the second electrode 107 covers the second variable resistance layer 106b.

In contrast, in the nonvolatile memory element 20, the second variable resistance layer 106b is formed on the surface of the first variable resistance layer 106a, the protective layer 150 is formed on a portion of the surface of the second variable resistance layer 106b, and the remaining portion of the second variable resistance layer 106b and the protective layer 150 are covered by the second electrode 107.

According to this configuration, in the region 160 of the second variable resistance layer 106b which is in contact with both the first variable resistance layer 106a and the second electrode 107, it is possible to cause electric fields during the initial break operation to concentrate at the vertex 170 which, when seen from above the principal face, is formed by the two sides 161 and 162 of the region 160 and is not in contact with the edges of the variable resistance layer 106. In addition, since the first variable resistance layer 106a and the second variable resistance layer 106b are not affected by the etching of the protective layer 150, the movement of oxygen atoms during a resistance changing operation is not inhibited, and thus the resistance changing operation becomes stable. Accordingly, low voltage operation and stable operation of a minute element becomes possible, and a nonvolatile memory element that is suited for use in a large-scale memory can be realized.

Although the angle 164 of the interior angle of the vertex 170 of the polygon 163 defining the outline of the region 160 is, as an example, 90 degrees in the nonvolatile memory element 20 illustrated in (b) in FIG. 8, the angle 164 of the interior angle is not limited to 90 degrees. For example, the angle 164 of the interior angle may be 270 degrees.

Figure 9:
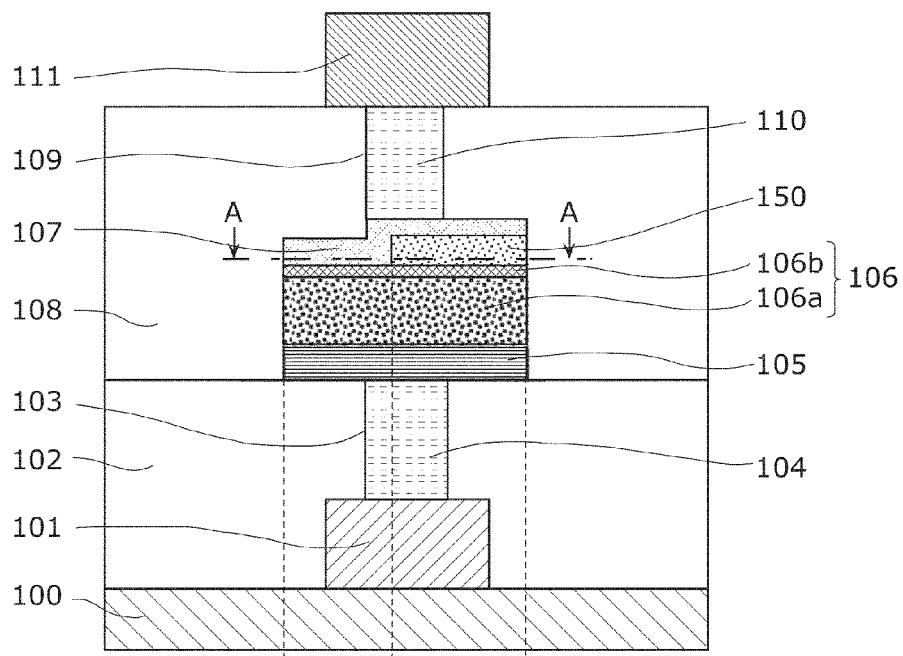
FIG. 9 illustrates, in (a), a vertical cross-sectional view of an example of a nonvolatile memory element in Embodiment 2, and, in (b), a horizontal cross-sectional view of a cross-section along line A-A as seen in the arrow direction.
Figure 9:
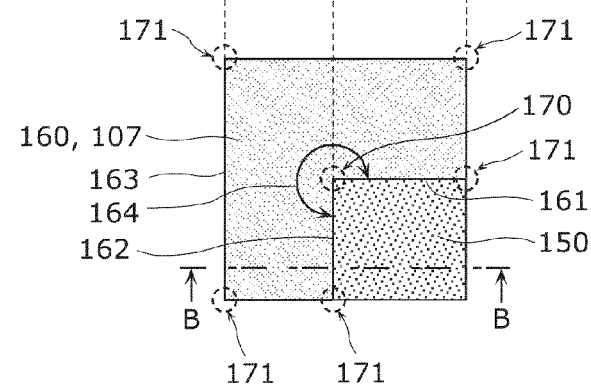

In FIG. 9, (a) is a vertical cross-sectional view of an example of a structure of a nonvolatile memory element 25, and (b) is a horizontal cross-sectional view of an example of the structure of the nonvolatile memory element 25. In FIG. 9, (a) is a cross-sectional view of the cross-section along line B-B in (b) as seen from arrow direction B, and (b) is a cross-sectional view of the cross-section along line A-A in (a) as seen from arrow direction A. The expressions vertical and horizontal are used with the same meanings as in the foregoing description. In FIG. 9, the same reference signs are used for structural components that are the same as in FIG. 8, and description thereof shall not be repeated. As illustrated in (b) in FIG. 9, in the nonvolatile memory element 25, the angle 164 of the interior angle is 270 degrees.

[Manufacturing Method]

FIG. 10A to FIG. 10E are cross-sectional views of examples of a method of manufacturing main parts of the nonvolatile memory element 20 or the nonvolatile memory element 25, and top views of the nonvolatile memory element 20 or the nonvolatile memory element 25 seen from above in the stacking direction. The nonvolatile memory element 20 or the nonvolatile memory element 25 is eventually formed, by being patterned, in the region surrounded by the outline illustrated in the top views in FIG. 10A to FIG. 10E as seen in the stacking direction.

A method of manufacturing main parts of the nonvolatile memory element 20 or the nonvolatile memory element 25 shall be described using the aforementioned figures. Furthermore, processes prior to FIG. 10A are the same as in FIG. 5A to FIG. 5F, and thus description thereof shall be omitted.

Figure 10A:
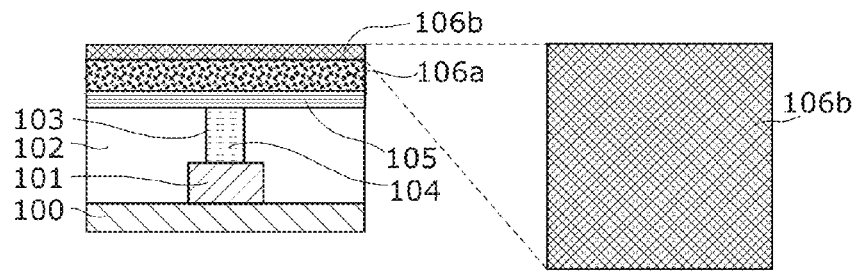
FIG. 10A is a cross-sectional view and a top view illustrating a method of manufacturing a nonvolatile memory element in Embodiment 2.

Next, as illustrated in FIG. 10A, in the process of forming the first variable resistance layer 106a and the second variable resistance layer 106b a lower degree of oxygen deficiency lower than the degree of oxygen deficiency of the first variable resistance layer 106a, the first variable resistance layer 106a and the second variable resistance layer 106b which comprise a metal oxide are formed on the conductive layer 105. Here, the first variable resistance layer 106a is formed using what is called the reactive sputtering method in which sputtering is performed on a tantalum target in an argon and oxygen gas atmosphere. The oxygen content atomic percentage of the first variable resistance layer 106a is at least 50 atm % and at most 65 atm %, the resistivity is at least 2 mΩcm and at most 50 mΩcm, and the film thickness is at least 20 nm and at most 100 nm. Next, in the same manner as in the first variable resistance layer 106a, the second variable resistance layer 106b is formed with the reactive sputtering method of performing sputtering on a tantalum target in an oxygen gas atmosphere. The oxygen content atomic percentage of the second variable resistance layer 106b is at least 67 atm % and at most 71 atm %, the resistivity is at least 107 mΩcm, and the film thickness is at least 2 nm and at most 10 nm.

Figure 10B:
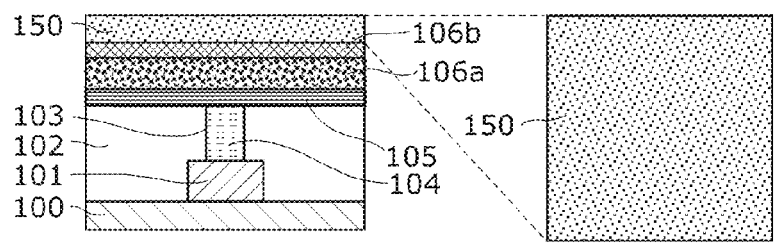
FIG. 10B is a cross-sectional view and a top view illustrating a method of manufacturing a nonvolatile memory element in Embodiment 2.

Next, as illustrated in FIG. 10B, in the process of forming the protective layer 150 on the second variable resistance layer 106b, the protective layer 150 is formed on the second variable resistance layer 106b. Here, the protective layer 150 is formed using a silicon nitride film (film thickness: at least 5 nm and at most 50 nm) formed using the plasma CVD method. The protective layer 150 comprises a material having an etching condition that allows for a higher etching rate than the first variable resistance layer 106a or the second variable resistance layer 106b. The protective layer 150 may, for example, be an insulating film containing silicon or an insulating film containing carbon.

Figure 10C:
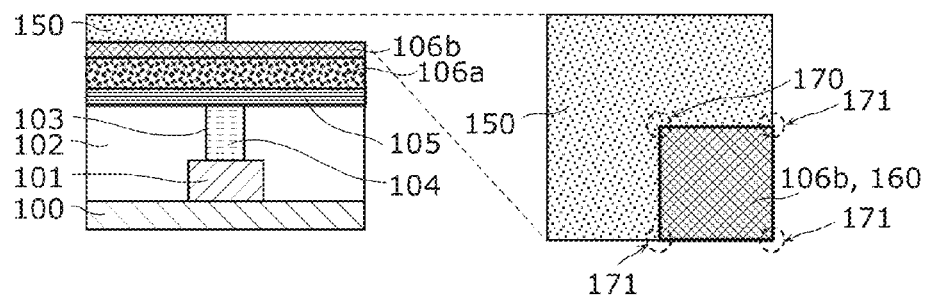
FIG. 10C is a cross-sectional view and a top view illustrating a method of manufacturing a nonvolatile memory element in Embodiment 2.
Figure 10D:
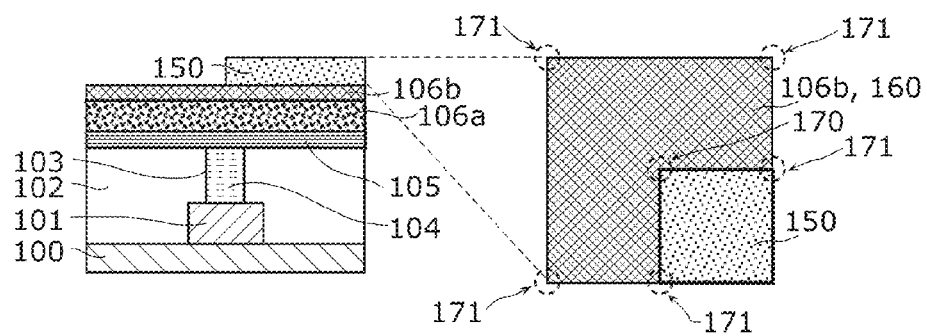
FIG. 10D is a cross-sectional view and a top view illustrating a method of manufacturing a nonvolatile memory element in Embodiment 2.

Next, as illustrated in FIG. 10C or FIG. 10D, in a process of processing the protective layer 150 to expose the second variable resistance layer 106b, a portion of the protective layer 150 is etched using the desired mask. At this time, an inert gas such as Ar may be used as an etching gas in order to prevent fluorine (F), and so on, included in the etching gas from entering the second variable resistance layer 106b and causing etching damage which causes the film quality of the variable resistance layer to deteriorate. Furthermore, since the protective layer 150 has a higher etching rate than the second variable resistance layer 106b and etching selectivity can be ensured, the surface of the second variable resistance layer 106b is not etched, and thus a uniform film thickness can be maintained. Furthermore, wet etching using an etching liquid containing hydrofluoric acid (HF) and so on may be performed. In this case, the fluorine (F) included in the etching liquid does not enter the variable resistance layer, and therefore does not cause the variable resistance layer to deteriorate.

As illustrated in the top views in FIG. 10C and FIG. 10D, seen in the stacking direction, the portion of the protective layer 150 which overlaps with the polygonal region 160 is removed. Here, the region 160 includes the single vertex 170, which is located inward of the outline surrounding the region in which the nonvolatile memory element 20 or the nonvolatile element 25 are formed, and the plural vertices 171 located along the outline. The portion from which the protective layer 150 has been removed is indicated by the second variable resistance layer 106b that is exposed.

In FIG. 10C, the portion of the protective layer 150 located at the bottom right of the top view is removed. This configuration in which such a portion of the protective layer 150 is removed corresponds to that in the nonvolatile memory element 20 in FIG. 8, in FIG. 10D, the portion of the protective layer 150 located at the bottom left, top left, and top right of the top view is removed. This configuration in which such a portion of the protective layer 150 is removed corresponds to that in the nonvolatile memory element 25 in FIG. 9.

Figure 10E:
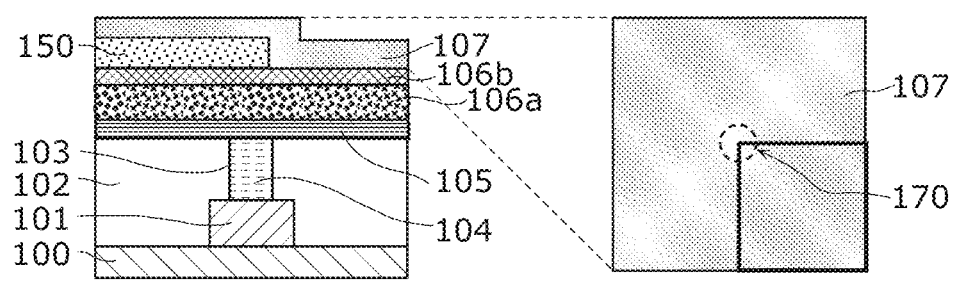
FIG. 10E is a cross-sectional view and a top view illustrating a method of manufacturing a nonvolatile memory element in Embodiment 2.

Next, as illustrated in FIG. 10E, in the process of forming a conductive layer 107 (the second electrode 107), the conductive layer 107 comprising a noble metal (platinum, iridium, palladium, and so on) which becomes the second electrode 107 is formed covering the exposed portion of the second variable resistance layer 106b and the protective layer 150.

The processes after FIG. 10E are the same as those in FIG. 7A and FIG. 7B, and thus description thereof shall be omitted.

According to the above-described manufacturing method, the first variable resistance layer 106a and the second variable resistance layer 106b can be formed successively, and the effects of damage from the etching of the protective layer 150 can be completely eliminated, and thus enabling stable resistance changing operation.

Embodiment 3

A nonvolatile memory element 30 according to Embodiment 3 shall be described below with reference to the drawings.

[Element Configuration]

Figure 11:
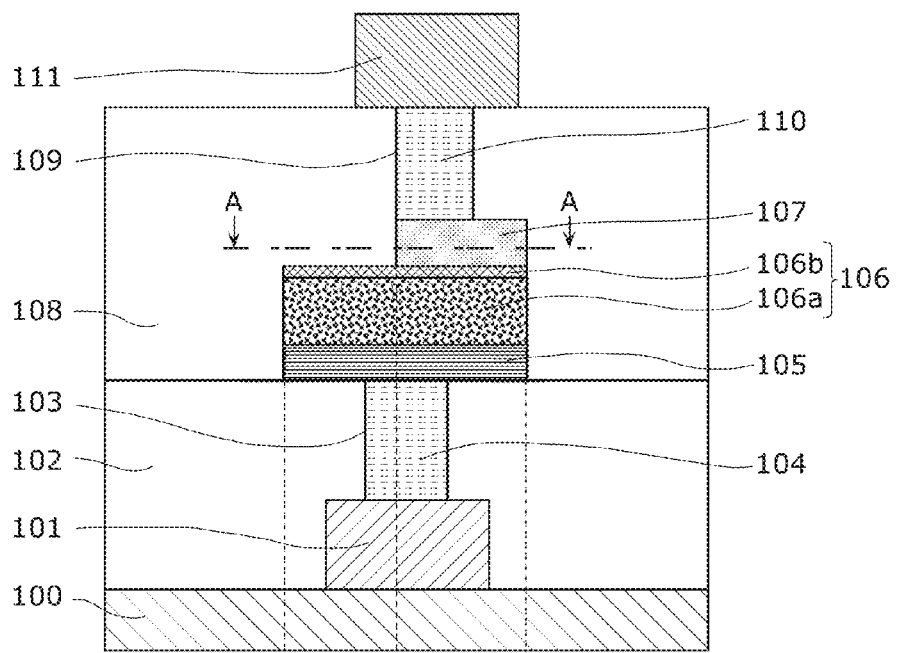
FIG. 11 illustrates, in (a), a vertical cross-sectional view of an example of a nonvolatile memory element in Embodiment 3, and, in (b), a horizontal cross-sectional view of a cross-section along line A-A as seen in the arrow direction.
Figure 11:
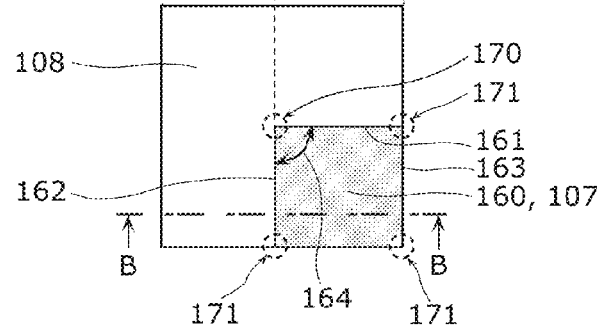

In FIG. 11, (a) is a vertical cross-sectional view of an example of a structure of a nonvolatile memory element 30, and (b) is a horizontal cross-sectional view of an example of the structure of the nonvolatile memory element 30. In FIG. 11, (a) is a cross-sectional view of the cross-section along line B-B in (b) as seen from arrow direction B, and (b) is a cross-sectional view of the cross-section along line A-A in (a) as seen from arrow direction A. The expressions vertical and horizontal are used with the same meanings as in the foregoing description. In FIG. 11, the same reference signs are used for structural components that are the same as in FIG. 1, and description thereof shall not be repeated.

As illustrated in (a) and (b) in FIG. 11, compared to the nonvolatile memory element 20 in FIG. 8, the nonvolatile memory element 30 is different in terms of the omission of the protective layer 150 and the shape of the second electrode 107.

Specifically, in the nonvolatile memory element 20, the second variable resistance layer 106b is formed on the surface of the first variable resistance layer 106a, the protective layer 150 is formed on a portion of the surface of the second variable resistance layer 106b, and the remaining portion of the second variable resistance layer 106b and the protective layer 150 are covered by the second electrode 107.

In contrast, in the nonvolatile memory element 30, the second variable resistance layer 106b is formed on the surface of the first variable resistance layer 106a. In addition, a region of the second variable resistance layer 106b is covered by the second electrode 107, and the remaining region of the second variable resistance layer 106b is covered by the second interlayer insulating layer 108.

According to this configuration, in the region 160 of the second variable resistance layer 106b which is in contact with both the first variable resistance layer 106a and the second electrode 107, it is possible to cause electric fields during the initial break operation to concentrate at the vertex 170 which, when seen from above the principal face, is formed by the two sides (for example, the side 161 in the X-direction and the side 162 in the Y-direction) of the region 160 and is not in contact with the edges of the variable resistance layer 106, and thus a nonvolatile memory element capable of low voltage operation can be provided.

Although the angle 164 of the interior angle of the vertex 170 of the polygon 163 defining the outline of the region 160 is, as an example, 90 degrees in the nonvolatile memory element 30 illustrated in (b) in FIG. 11, the angle 164 of the interior angle is not limited to 90 degrees. For example, the angle 164 of the interior angle may be 270 degrees.

Figure 12:
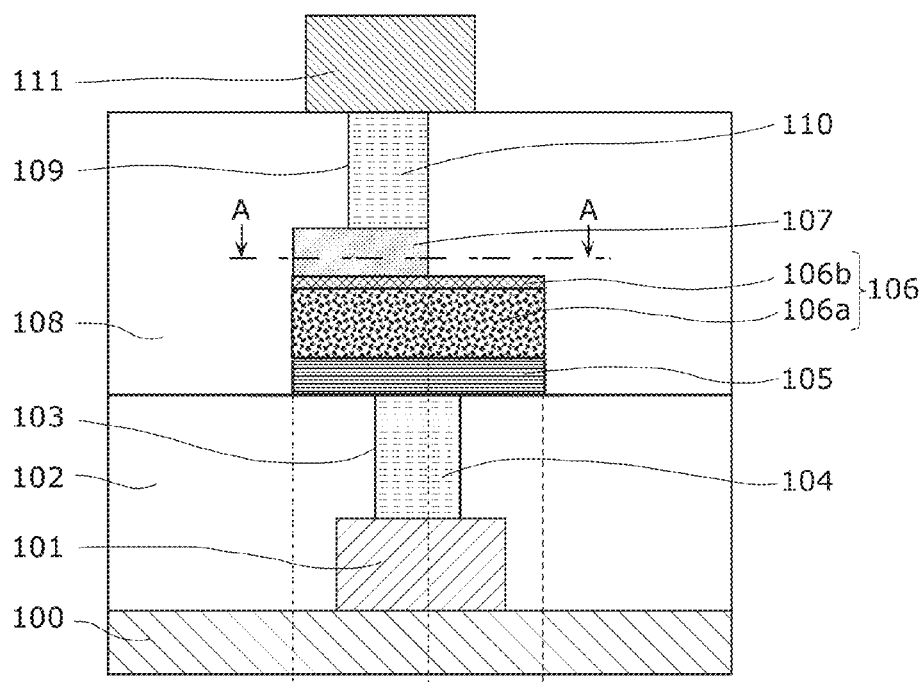
FIG. 12 illustrates, in (a), a vertical cross-sectional view of an example of a nonvolatile memory element in Embodiment 3, and, in (b), a horizontal cross-sectional view of a cross-section along line A-A as seen in the arrow direction.
Figure 12:
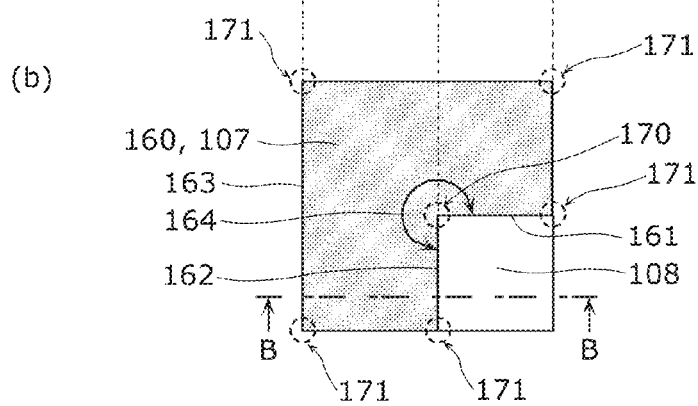

In FIG. 12, (a) is a vertical cross-sectional view of an example of a structure of a nonvolatile memory element 35, and (b) is a horizontal cross-sectional view of an example of the structure of the nonvolatile memory element 35. In FIG. 12, (a) is a cross-sectional view of the cross-section along line B-B in (b) as seen from arrow direction B, and (b) is a cross-sectional view of the cross-section along line A-A in (a) as seen from arrow direction A. The expressions vertical and horizontal are used with the same meanings as in the foregoing description. In FIG. 12, the same reference signs are used for structural components that are the same as in FIG. 11, and description thereof shall not be repeated. As illustrated in (b) in FIG. 12, in the nonvolatile memory element 35, the angle 164 of the interior angle is 270 degrees.

[Manufacturing Method]

FIG. 13A to FIG. 13E are cross-sectional views of a method of manufacturing main parts of the nonvolatile memory element 30 or the nonvolatile memory element 35, and top views of the nonvolatile memory element 30 or the nonvolatile memory element 35 seen from above in the stacking direction. The nonvolatile memory element 30 or the nonvolatile memory element 35 is eventually formed, by being patterned, in the region surrounded by the outline illustrated in the top views in FIG. 13A to FIG. 13E as seen in the stacking direction.

A method of manufacturing main parts of the nonvolatile memory element 30 or the nonvolatile memory element 35 shall be described using the aforementioned figures. Furthermore, processes prior to FIG. 13A are the same as in FIG. 5A to FIG. 5F, and thus description thereof shall be omitted.

Figure 13A:
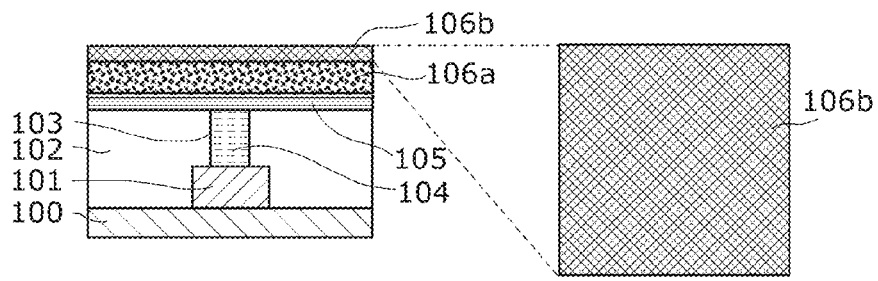
FIG. 13A is a cross-sectional view and a top view illustrating a method of manufacturing a nonvolatile memory element in Embodiment 3.

As illustrated in FIG. 13A, in the process of forming the first variable resistance layer 106a and the second variable resistance layer 106b having an oxygen content atomic percentage higher than the oxygen content atomic percentage of the first variable resistance layer 106a, the first variable resistance layer 106a and the second variable resistance layer 106b which comprise a metal oxide are formed on the conductive layer 105. Here, the first variable resistance layer 106a is formed using what is called the reactive sputtering method in which sputtering is performed on a tantalum target in an argon and oxygen gas atmosphere. The oxygen content atomic percentage of the first variable resistance layer 106a is at least 50 atm % and at most 65 atm %, the resistivity is at least 2 mΩcm and at most 50 mΩcm, and the film thickness is at least 20 nm and at most 100 nm. Next, in the same manner as in the first variable resistance layer 106a, the second variable resistance layer 106b is formed with the reactive sputtering method of performing sputtering on a tantalum target in an oxygen gas atmosphere. The oxygen content atomic percentage of the second variable resistance layer 106b is at least 67 atm % and at most 71 atm %, the resistivity is at least 107 mΩcm, and the film thickness is at least 2 nm and at most 10 nm.

Figure 13B:
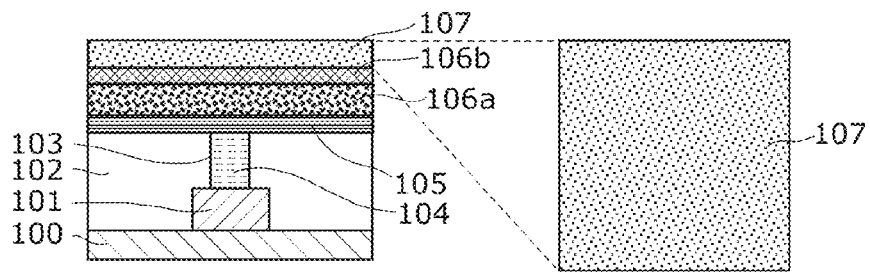
FIG. 13B is a cross-sectional view and a top view illustrating a method of manufacturing a nonvolatile memory element in Embodiment 3.

Next, as illustrated in FIG. 13B, in the process of forming the conductive layer 107 (the second electrode 107), the conductive layer 107 comprising a noble metal (platinum, iridium, palladium, and so on) which becomes the second electrode 107 is formed on the second variable resistance layer 106b.

Figure 13C:
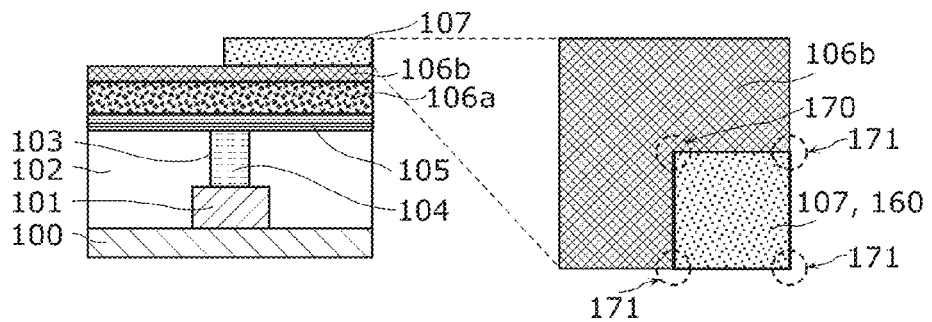
FIG. 13C is a cross-sectional view and a top view illustrating a method of manufacturing a nonvolatile memory element in Embodiment 3.
Figure 13D:
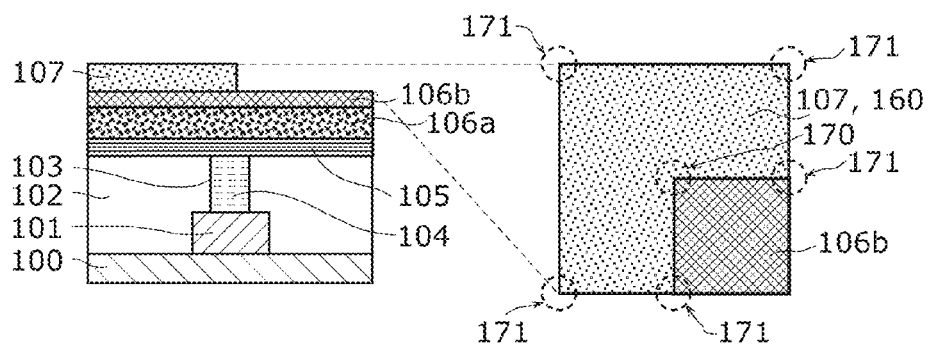
FIG. 13D is a cross-sectional view and a top view illustrating a method of manufacturing a nonvolatile memory element in Embodiment 3.

Next, as illustrated in FIG. 13C or FIG. 13D, in the process of forming the conductive layer 107 (the second electrode 107), patterning using the desired mask is performed on the conductive layer 107 illustrated in FIG. 13B to form the region 160 of the second variable resistance layer 106b which is in contact with both the first variable resistance layer 106a and the first electrode 107.

As illustrated in the top views in FIG. 13C and FIG. 13D, seen in the stacking direction, the portion of the conductive layer 107 which does not overlap with the polygonal region 160 is removed. Here, the region 160 includes the single vertex 170, which is located inward of the outline surrounding the region in which the nonvolatile memory element 30 or the nonvolatile element 35 are formed, and the plural vertices 171 located along the outline. The portion from which the conductive layer 107 has been removed is indicated by the second variable resistance layer 106b that is exposed.

In FIG. 13C, the portion of the conductive layer 107 located at the bottom left, top left, and top right of the top view is removed. This configuration in which such a portion of the conductive layer 107 is removed corresponds to that in the nonvolatile memory element 30 in FIG. 11. In FIG. 13D, the portion of the conductive layer 107 located at the bottom right of the top view is removed. This configuration in which such a portion of the conductive layer 107 is removed corresponds to that in the nonvolatile memory element 35 in FIG. 12.

Figure 13E:
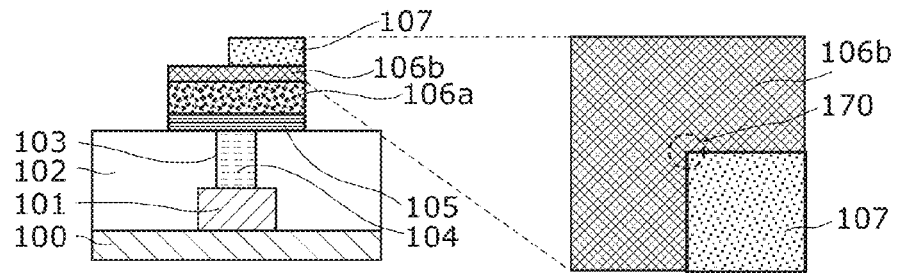
FIG. 13E is a cross-sectional view and a top view illustrating a method of manufacturing a nonvolatile memory element in Embodiment 3.

Next, as illustrated in FIG. 13E, in the process of forming the variable resistance element, patterning using the desired mask is performed on the conductive layer 105, the first variable resistance layer 106a, the second variable resistance layer 106b, and the conductive layer 107 illustrated in FIG. 13C to form the variable resistance element configured of the stacked layers of the first variable resistance layer 106a and the second variable resistance layer 106b.

Lastly, the second interlayer insulating layer 108 (film thickness: at least 500 nm and at most 1000 nm) is formed covering the variable resistance element, and the second contact hole 109 and the second contact plug 110 are formed according to the same manufacturing method as in FIG. 5B and FIG. 5C. Subsequently, the second line 111 is formed covering the second contact plug 110, and the nonvolatile memory element 30 is completed.

According to this manufacturing method, in the region 160 of the second variable resistance layer 106b which is in contact with both the first variable resistance layer 106a and the second electrode 107, the angle formed by the vertex 170, which, when seen from the top face of the variable resistance element, is formed by the two sides 161 and 162 of the region 160 and is not in contact with the edges of the variable resistance layer 106, can be formed precisely, and thus a variable resistance element having a stable initial break voltage can be realized.

INDUSTRIAL APPLICABILITY

Variable resistance elements disclosed herein enable lowering of initial break voltage without increasing variation in element characteristics even when miniaturized, and are useful when applied to a nonvolatile memory device operating at low voltage.

REFERENCE SIGNS LIST 10, 15, 20, 25, 30, 35 Nonvolatile memory element
100 Substrate
101 Line
102 First interlayer insulating layer
103 Contact hole
104 Contact plug, conductive layer 105 First electrode, conductive layer
106 Variable resistance layer
106a First variable resistance layer
106b Second variable resistance layer
107 Second electrode, conductive layer
108 Second interlayer insulating layer
109 Contact hole
110 Contact plug
111 Line
150 Protective layer
160 Region
161, 162 Side
163 Polygon
164 Angle
170, 171 Vertex

The invention claimed is:

1. A nonvolatile memory element comprising:
a first electrode;
a second electrode; and
a variable resistance layer between the first electrode and the second electrode and having a resistance value that reversibly changes according to an electrical signal applied between the first electrode and the second electrode,
wherein the variable resistance layer includes a first variable resistance layer and a second variable resistance layer, the first variable resistance layer comprising a first metal oxide and contacting the first electrode, the second variable resistance layer comprising a second metal oxide and contacting the second electrode, the second metal oxide having a degree of oxygen deficiency lower than the degree of oxygen deficiency of the first metal oxide,
a principal face of the first variable resistance layer which is close to the second variable resistance layer is flat, and the second variable resistance layer is in contact with both the first variable resistance layer and the second electrode in an interior region of a polygon including a single first vertex located inward of an outline of the variable resistance layer and plural second vertices located along the outline of the variable resistance layer when seen from a direction perpendicular to the principal face of the variable resistance layer, and is not in contact with at least one of the first variable resistance layer and the second electrode in a region outside the interior region of the polygon.

2. The nonvolatile memory element according to claim 1, wherein an interior angle of the first vertex of the polygon is greater than 0 degrees and less than or equal to 90 degrees, or greater than or equal to 270 degrees and less than 360 degrees.

3. The nonvolatile memory element according to claim 1, wherein a protective layer is provided between the first variable resistance layer and the second variable resistance layer, in the region outside the interior region of the polygon.

4. The nonvolatile memory element according to claim 1, wherein a protective layer is provided between the second variable resistance layer and the second electrode, in the region outside the interior region of the polygon.

5. The nonvolatile memory element according to claim 1, wherein the second electrode is provided only in the interior region of the polygon.

6. The nonvolatile memory element according to claim 1, wherein each of the first metal oxide and the second metal oxide is a transition metal oxide or aluminum oxide.

7. The nonvolatile memory element according to claim 6, wherein the transition metal oxide is any one of tantalum oxide, hafnium oxide, and zirconium oxide.

* * * * *